US012764999B2

(12) United States Patent
Xie et al.

(10) Patent No.: US 12,764,999 B2
(45) Date of Patent: Oct. 13, 2026

(54) BACKSIDE WRAP AROUND CONTACT STRUCTURE

(71) Applicant: International Business Machines Corporation, Armonk, NY (US)

(72) Inventors: Ruilong Xie, Niskayuna, NY (US); Alexander Reznicek, Troy, NY (US); Tsung-Sheng Kang, Ballston Lake, NY (US); Sagarika Mukesh, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 18/606,741

(22) Filed: Mar. 15, 2024

(65) Prior Publication Data

US 2025/0294806 A1 Sep. 18, 2025

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 62/13*** | (2025.01) |

(52) U.S. Cl.

CPC ....... *H10D 30/6729* (2025.01); *H10D 30/014* (2025.01); *H10D 30/031* (2025.01); *H10D 30/43* (2025.01); *H10D 30/6757* (2025.01); *H10D 62/151* (2025.01)

(58) Field of Classification Search

CPC ............. H10D 30/6729; H10D 30/014; H10D 30/031; H10D 30/43; H10D 30/6757; H10D 62/121; H10D 30/6735

See application file for complete search history.

(56) References Cited

U.S. PATENT DOCUMENTS

| | | | |
|---|---|---|---|
| 10,192,867 | B1 | 1/2019 | Frougier et al. |
| 10,510,622 | B1 | 12/2019 | Frougier et al. |
| 11,322,590 | B2 | 5/2022 | Jung et al. |
| 2021/0111115 | A1 | 4/2021 | Morrow et al. |
| 2021/0134721 | A1 | 5/2021 | Chiang et al. |
| 2021/0202385 | A1 | 7/2021 | Huang et al. |
| 2021/0305252 | A1 | 9/2021 | Chiang et al. |
| 2021/0305381 | A1 | 9/2021 | Chiang et al. |
| 2021/0351303 | A1 | 11/2021 | Ju et al. |
| 2021/0376071 | A1 | 12/2021 | Liu et al. |
| 2021/0376093 | A1 | 12/2021 | Chu et al. |
| 2021/0399099 | A1 | 12/2021 | Chu et al. |
| 2022/0352032 | A1 | 11/2022 | Lilak et al. |

(Continued)

FOREIGN PATENT DOCUMENTS

EP 3671825 A1 6/2020

*Primary Examiner* — Thanh Y. Tran

(74) *Attorney, Agent, or Firm* — Scully, Scott, Murphy & Presser, P.C.; Kimberly Zillig

(57) ABSTRACT

A semiconductor device is provided that includes a transistor located on a frontside of a dielectric layer, the transistor includes a source/drain region located on a first side of a gate structure and a source/drain trench structure located on a second side of the gate structure. The source/drain trench structure extends through the dielectric layer and has an upper portion located on the frontside of the dielectric layer and a lower portion located on the backside of the dielectric layer. A backside wrap around contact structure is present that physically contacts, and wraps around, the lower portion of the source/drain trench structure.

20 Claims, 24 Drawing Sheets

(56) References Cited

U.S. PATENT DOCUMENTS

| | | | | |
|---|---|---|---|---|
| 2023/0132053 | A1 | 4/2023 | Lilak et al. | |
| 2025/0192048 | A1* | 6/2025 | Zhang | H10W 20/069 |
| 2025/0254945 | A1* | 8/2025 | Kang | H10D 62/151 |

* cited by examiner 22
16
24
16
24
16
24
12B
13
46
44
40
T3
38
42
22
26
T1
38
40
36
T2
38
24
16
12A 12B
13
46
44
40
42
26
16
36
26
12A

BACKSIDE WRAP AROUND CONTACT STRUCTURE

BACKGROUND

The present application relates to semiconductor technology, and more particularly to a semiconductor device including a backside wrap around contact structure that does not substantially increase the backside source/drain contact-to-gate capacitance.

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits. Semiconductor devices are coupled to external circuits through frontside and backside contacts.

SUMMARY

A semiconductor device is provided that includes a transistor located on a frontside of a dielectric layer, the transistor includes a source/drain trench structure located on one side of a gate structure. The source/drain trench structure passes through the dielectric layer and has an upper portion located on the frontside of the dielectric layer and a lower portion located on the backside of the dielectric layer. A backside wrap around contact structure is present that physically contacts, and wraps around, the lower portion of the source/drain trench structure. In the present device, there is an increased contact area between the backside wrap around contact structure and the source/drain trench structure, yet no significant increase in backside source/drain contact-to-gate capacitance is observed.

In one embodiment of the present application, the semiconductor device includes a transistor located on a frontside of a dielectric layer, the transistor includes a source/drain region located on a first side of a gate structure and a source/drain trench structure located on a second side of the gate structure. The source/drain trench structure extends through the dielectric layer, has an upper portion located on the frontside of the dielectric layer and a lower portion located on the backside of the dielectric layer. The device further includes a backside wrap around contact structure that physically contacts, and wraps around, the lower portion of the source/drain trench structure. In this embodiment, the backside wrap around contact structure is in direct contact with the dielectric layer and has a topmost surface that is lower than a bottommost surface of the gate structure.

In another embodiment, the semiconductor device includes a transistor located on a frontside of a dielectric layer, the transistor includes a source/drain region located on a first side of a gate structure and a source/drain trench structure located on a second side of the gate structure. The source/drain trench structure extends through the dielectric layer and an etch stop layer that is located beneath the dielectric layer, has an upper portion located on the frontside of the dielectric layer and a lower portion located on the backside of the dielectric layer. The device further includes a backside wrap around contact structure that physically contacts, and wraps around, the lower portion of the source/drain trench structure. In this embodiment, the backside wrap around contact structure is spaced apart from the dielectric layer by the etch stop layer. In this embodiment, the backside wrap around contact structure can also have a topmost surface that is lower than a bottommost surface of the gate structure.

DETAILED DESCRIPTION

Figure 1:
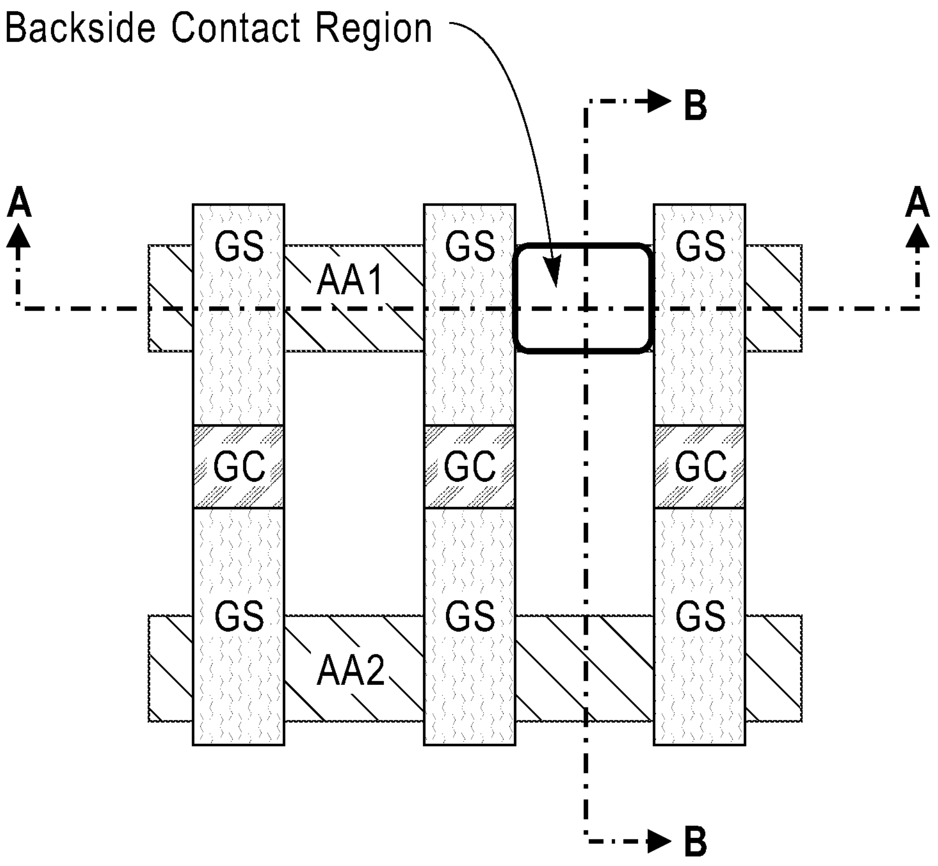
FIG. 1 is a top down view illustrating a device layout that can be used in the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g., the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

A semiconductor device is provided that includes a transistor located on a frontside of a dielectric layer, the transistor includes a source/drain trench structure located on one side of a gate structure in which the source/drain trench structure passes through the dielectric layer and has an upper portion located on the frontside of the dielectric layer and a lower portion located on the backside of the dielectric layer. A backside wrap around contact structure is present that physically contacts, and wraps around, the lower portion of the source/drain trench structure, yet it is isolated from the gate structure by at least the dielectric layer. In the present semiconductor device, there is an increased contact area between the backside wrap around contact structure and the source/drain trench structure, yet no significant increase in backside source/drain contact-to-gate capacitance is observed.

A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. In the embodiment described in the present application, the transistor is a nanosheet transistor. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps around each of the spaced apart semiconductor channel material nanosheets. Nanosheet transistors provide considerable scaling with high drive current capability. Nanosheet transistors provide a larger drive current for a given footprint compared to finFET technology. Although nanosheet transistors are described in this application, this application is not limited to nanosheet transistors. Instead, the present application can be used for finFETs, nanowire FETs, planar FETs, fork sheet transistors, stacked FETs or any combination of such FETs including nanosheet transistors.

In the present application, the semiconductor device includes a frontside and a backside. The frontside includes a side of the device that includes at least one transistor, frontside contact structures, and a frontside BEOL structure. The backside of the semiconductor device is the side of the device that is opposite the frontside. The backside includes a backside wrap around contact structure, and a backside interconnect structure.

Referring now to FIG. 1, there illustrated a device layout that can be used in the present application. The device layout includes a first active area, AA1, and a second active area, AA2, that are spaced apart by a non-active device region in which a gate cut structure, GC, will be formed. The device layout includes gate structures, GS, which run parallel to each other and perpendicular to AA1 and AA2, and each gate structure is cut by the gate cut structure as is illustrated in FIG. 1. The device layout includes cut A-A which is through a lengthwise direction of AA1. The device layout illustrated in FIG. 1 also includes cut B-B. Cut B-B is through an area that is between two of the gate structures and it extends from AA1 to AA2. Cut B-B includes a backside contact region as is shown in FIG. 1. The backside contact region is an area in which a backside wrap around contact structure in accordance with the present application is formed.

Figure 2A:
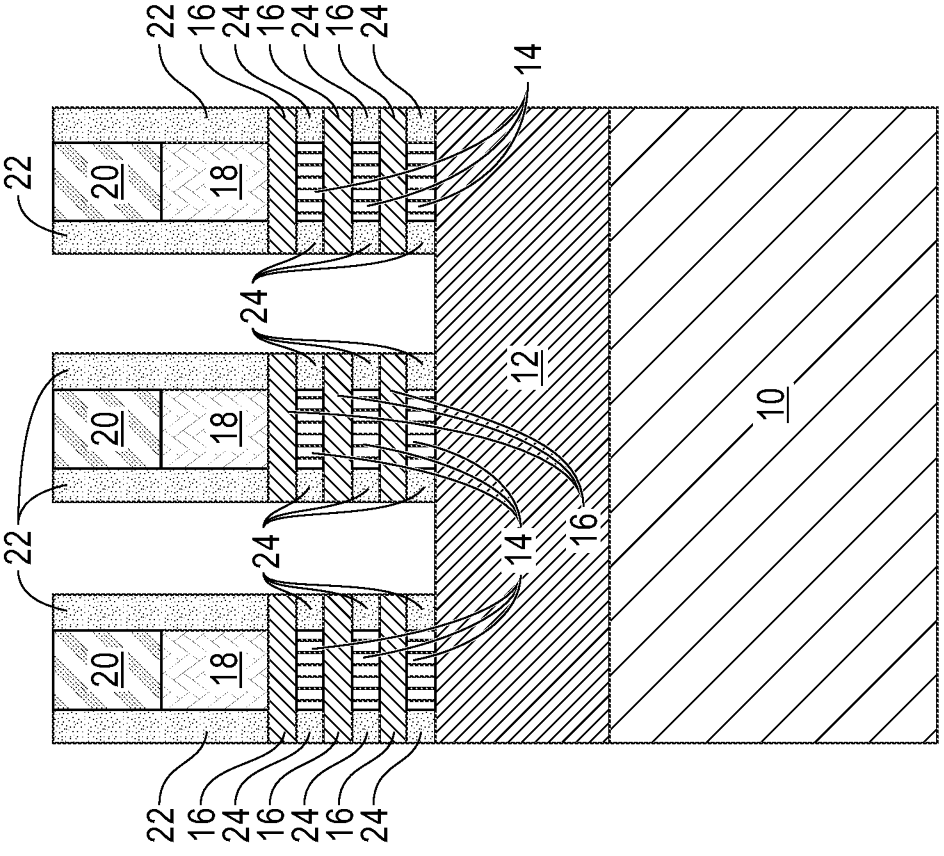
FIGS. 2A-2B are cross sectional views of an exemplary structure through cut A-A and cut B-B, respectively, of FIG. 1 that can be employed in accordance with an embodiment of the present application, the exemplary structure includes a substrate including a dielectric layer, at least one nanosheet stack of alternating sacrificial semiconductor material nanosheets and semiconductor channel material nanosheets located on the dielectric layer, and a sacrificial gate structure located on the at least one nanosheet stack.
Figure 2B:
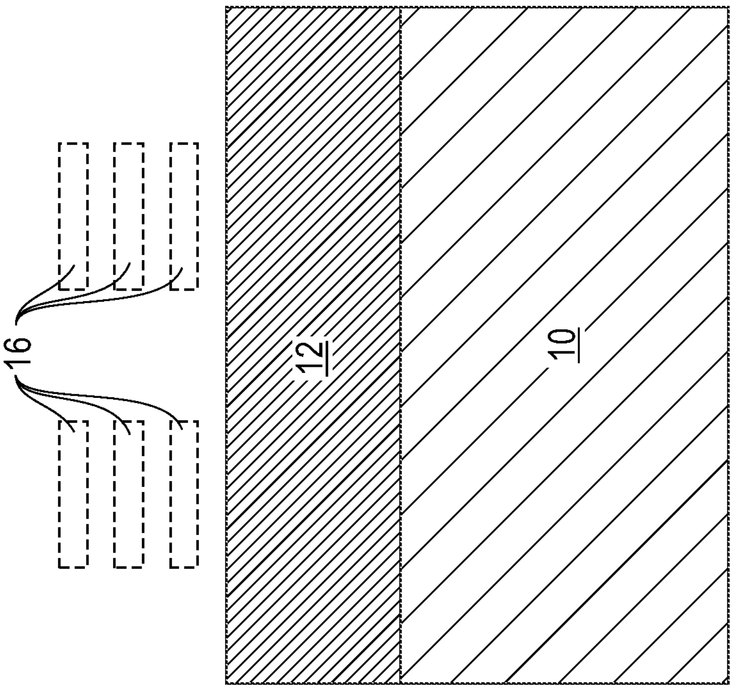

Referring now to FIGS. 2A-2B, there are illustrated an exemplary structure through cut A-A and cut B-B, respectively, of FIG. 1 that can be employed in accordance with an embodiment of the present application. The exemplary structure includes a substrate including a dielectric layer 12 that is located on a semiconductor base layer 10, at least one nanosheet stack (three of which are shown by way of one example) of alternating sacrificial semiconductor material nanosheets 14 and semiconductor channel material nanosheets 16 located on the dielectric layer 12, and a sacrificial gate structure 18 located on the at least one nanosheet stack. It is noted that in FIG. 2B the semiconductor channel material nanosheets 16 are represented by dotted lines to emphasize that the nanosheet stack including those nanosheets would be into and out of the plane of the drawing sheet in the area along the cut B-B. The exemplary structure can further include a hard mask cap 20, a gate spacer 22, and inner spacers 24, as shown in FIG. 2A. In some embodiments, the hard mask cap 20 can be omitted. When present, the hard mask cap 20 is located on a topmost surface of the sacrificial gate structure 18. The gate spacer 22 is located on a sidewall of the sacrificial gate structure 18 and, if present, a sidewall of the hard mask cap 20. The inner spacers 24 are located at both ends of each of the sacrificial semiconductor material nanosheets 14 and beneath each of the semiconductor channel material nanosheets 16. The various components/elements present in FIGS. 2A-2B will now be described in greater detail.

The semiconductor base layer 10 of the substrate is composed of a first semiconductor material having semiconducting properties. Examples of first semiconductor materials that can be used in the present application include, but are not limited to, silicon (Si), a silicon germanium (SiGe) alloy, a silicon germanium carbide (SiGeC) alloy, germanium (Ge), III/V compound semiconductors or II/VI compound semiconductors.

The dielectric layer 12 is composed of a dielectric material such as, for example, silicon dioxide and/or boron nitride. The dielectric layer 12 is typically, but not necessarily always, a buried oxide layer of a semiconductor-on-insulator (SOI) substrate that includes the semiconductor base layer 10, the dielectric layer 12, and an upper semiconductor layer which can be removed or processed during the formation of the exemplary structure illustrated in FIGS. 2A-2B.

As mentioned above, the nanosheet stack includes alternating sacrificial semiconductor material nanosheets 14 and semiconductor channel material nanosheets 16. In some embodiments and as is illustrated in FIG. 2A, the material stack can include an equal number of sacrificial semiconductor material nanosheets 14 and semiconductor channel material nanosheets 16. Although not illustrated, the present application works when the nanosheet stack includes "n" number of semiconductor channel material nanosheets 16 and "n+1" number of sacrificial semiconductor material nanosheets 14, wherein n is an integer starting from 1, typically n is 2 or more. In such an embodiment, each semiconductor channel material nanosheet 16 would be sandwiched between a bottom sacrificial semiconductor material nanosheet and a top sacrificial semiconductor material nanosheet.

Each sacrificial semiconductor material nanosheet 14 is composed of a second semiconductor material, while each semiconductor channel material nanosheet 16 is composed of a third semiconductor material that is compositionally different from the second semiconductor material. In some embodiments, the third semiconductor material that provides each semiconductor channel material nanosheet 16 can provide high channel mobility for n-type FET devices (i.e., NFETs). In other embodiments, the third semiconductor material that provides each semiconductor channel material nanosheet 16 can provide high channel mobility for p-type FET devices (PFETs). The second semiconductor material that provides each sacrificial semiconductor material nanosheet 14, and the third semiconductor material that provides each semiconductor channel material nanosheet 16 can include one of the semiconductor materials mentioned above for the semiconductor base layer 10. In one example, the second semiconductor material that provides each sacrificial semiconductor material nanosheet 14 is composed of a silicon germanium alloy having a germanium content from 20 atomic percent to 40 atomic percent and the third semiconductor material that provides each semiconductor channel material nanosheet 16 is composed of silicon. Other combinations of semiconductor materials are possible as long as the second semiconductor material is compositionally different from the third semiconductor material.

The sacrificial gate structure 18 includes at least a sacrificial gate material. In some embodiments, the sacrificial gate structure 18 can also include a sacrificial gate dielectric material. In such embodiments, the sacrificial gate dielectric material would be located beneath the sacrificial gate material. The optional sacrificial gate dielectric material can be composed of a dielectric material such as, for example, silicon dioxide. The sacrificial gate material can be composed of, for example, polysilicon, amorphous silicon, amorphous silicon germanium or amorphous germanium.

The hard mask cap 20 is composed of any dielectric hard mask material such as, for example, silicon nitride, silicon oxide, and/or silicon oxynitride.

The gate spacer 22 and the inner spacers 24 are composed of a dielectric spacer material including, but not limited to, silicon dioxide, SiN, SiBCN, SiOCN or SiOC. The gate spacer 22 can be composed of a compositionally same dielectric spacer material as, or a compositionally different dielectric spacer material than, the inner spacers 24.

The exemplary structure illustrated in FIGS. 2A-2B can be formed utilizing any well-known nanosheet formation process. For example, the nanosheet formation process can include, for example, various deposition and patterning steps. The depositions can include, but are not limited, chemical vapor deposition (CVD), plasma enhanced chemical vapor deposition (PECVD), physical vapor deposition (PVD), and atomic layer deposition (ALD). In some embodiments, an epitaxial growth process can be used to form blanket layers of the second and third semiconductor materials that provide the nanosheet stack illustrated in FIG. 2A. The sacrificial gate structure 18 and, if present, the hard mask cap 20 can then be formed by deposition of a blanket layer of at least the sacrificial gate material, followed by deposition of a blanket layer of the dielectric hard mask material. The blanket layer of at least the sacrificial gate material and the blanket layer of the dielectric hard mask material are then patterned to form the sacrificial gate structure 18 and the hard mask cap 20, respectively. Patterning can include lithography and etching (dry etching and/or chemical wet etching). Dry etching can include, for example, reactive ion etching (RIE), ion beam etching (IBE), and plasma etching. Chemical wet etching includes the use of an appropriate chemical etchant that has a high etch rate for one material as compared to at least one another material. Gate spacer 22 is then formed by deposition of at least one of the dielectric spacer materials mentioned above, followed by a spacer etch. The blanket layers of the second and third semiconductor materials can then be patterned by a nanosheet etch in which the sacrificial gate structure 18 and the gate spacer 22 are used as a combined etch mask. The patterning of the blanket layers of the second and third semiconductor materials provides the nanosheet stack(s) illustrated in FIG. 2A. Next, inner spacers 24 are formed by first indenting (via a recess etching process) each sacrificial semiconductor material nanosheet 14, then depositing one of the above dielectric spacer materials in the gap created by the indenting, and thereafter removing any deposited dielectric spacer material that is formed outside of the gap.

Figure 3A:
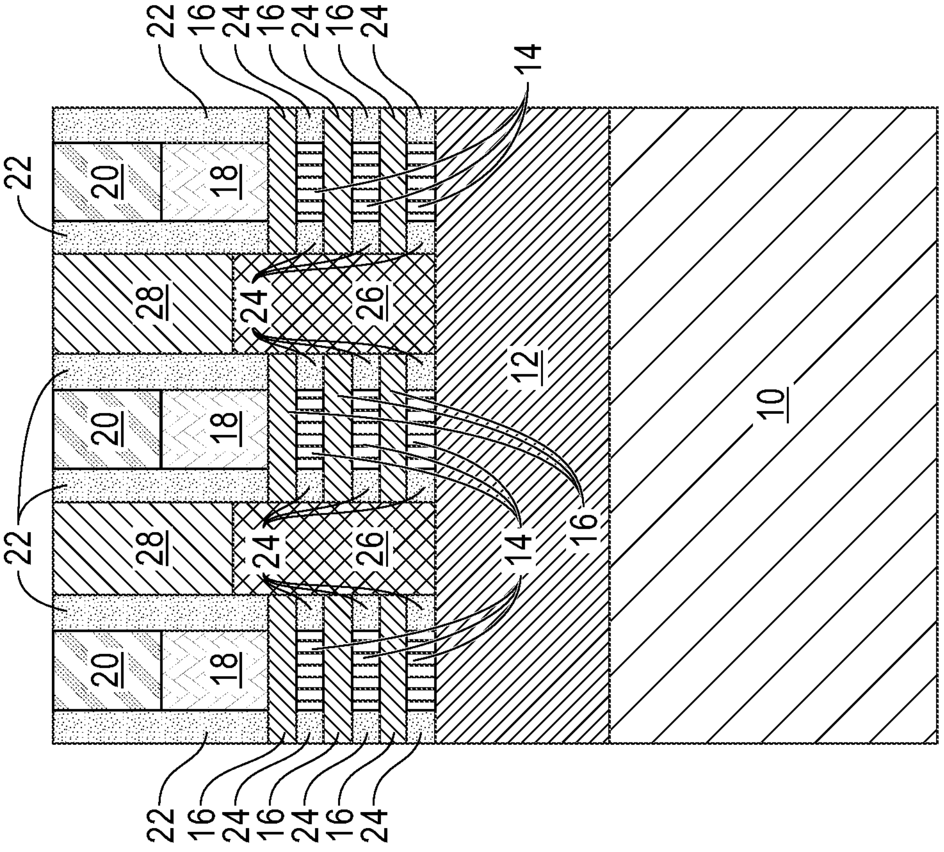
FIGS. 3A-3B are cross sectional views of the exemplary structure shown in FIGS. 2A-2B, respectively, after forming source/drain regions and a frontside interlayer dielectric (ILD) layer.
Figure 3B:
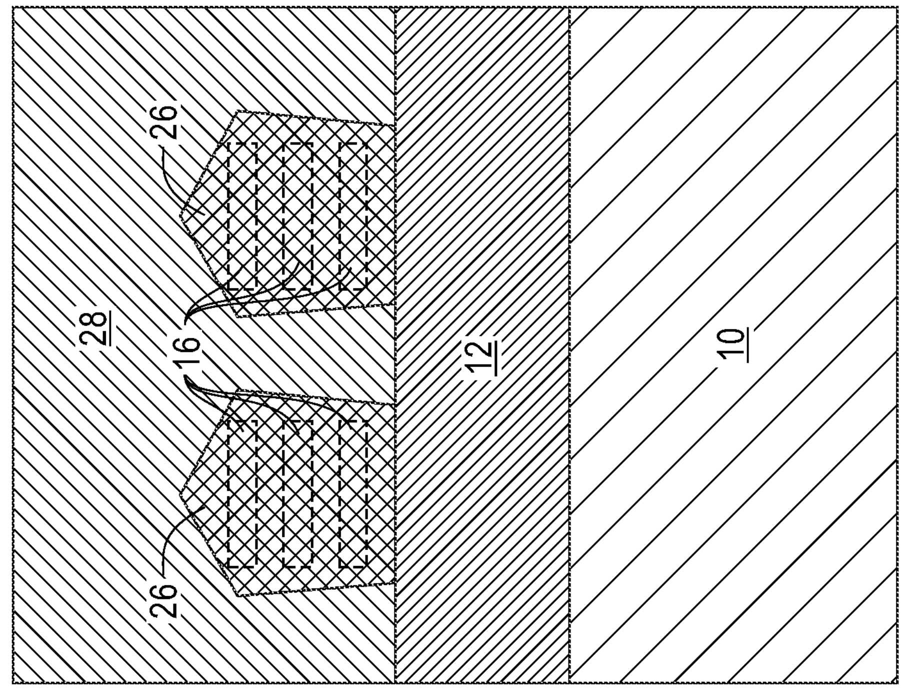

Referring now to FIGS. 3A-3B, there are illustrated the exemplary structure shown in FIGS. 2A-2B, respectively, after forming source/drain regions 26 and a frontside ILD layer 28. Source/drain regions 26 are formed entirely above the dielectric layer 12 and on the frontside of the structure. The source/drain regions 26 are typically formed by an epitaxial growth process. Throughout the present application, the terms "epitaxial growth" or "epitaxially growing" mean the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 450° C. to 900° C. Although higher temperature typically results in faster deposition, the faster deposition may result in crystal defects and film cracking.

The source/drain regions 26 extend outward from a sidewall of each semiconductor channel material nanosheet 16. Each source/drain region 26 is composed of a fourth semiconductor material and a dopant. As used herein, a "source/drain" region can be a source region or a drain region depending on subsequent wiring and application of voltages during operation of the transistor. The fourth semiconductor material that provides each source/drain region 26 is composed of one of the semiconductor materials mentioned above for the semiconductor base layer 10. The fourth semiconductor material that provides the source/drain regions 26 can be compositionally the same as, or compositionally different from, the third semiconductor material that provides each semiconductor channel material nanosheet 16. The fourth semiconductor material that provides each source/drain region 26 is however compositionally different from the second semiconductor material that provides each sacrificial semiconductor material nanosheet 14. The dopant that is present in the source/drain regions 26 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each of the source/drain regions 26 can have a dopant concentration of from $4\times10^{20}$ atoms/$cm^3$ to $3\times10^{21}$ atoms/$cm^3$.

The frontside ILD layer 28 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). The frontside ILD layer 28 can be formed by a deposition process including, but not limited to, CVD, PECVD or spin-on coating. A planarization process such as, for example, chemical mechanical polishing (CMP) follows the deposition process. The planarization process can stop on a surface of the hard mask cap 20 (if the same is present) or, when the hard mask cap 20 is not present, the planarization process can stop on an upper portion of the sacrificial gate structure 18.

Figure 4B:
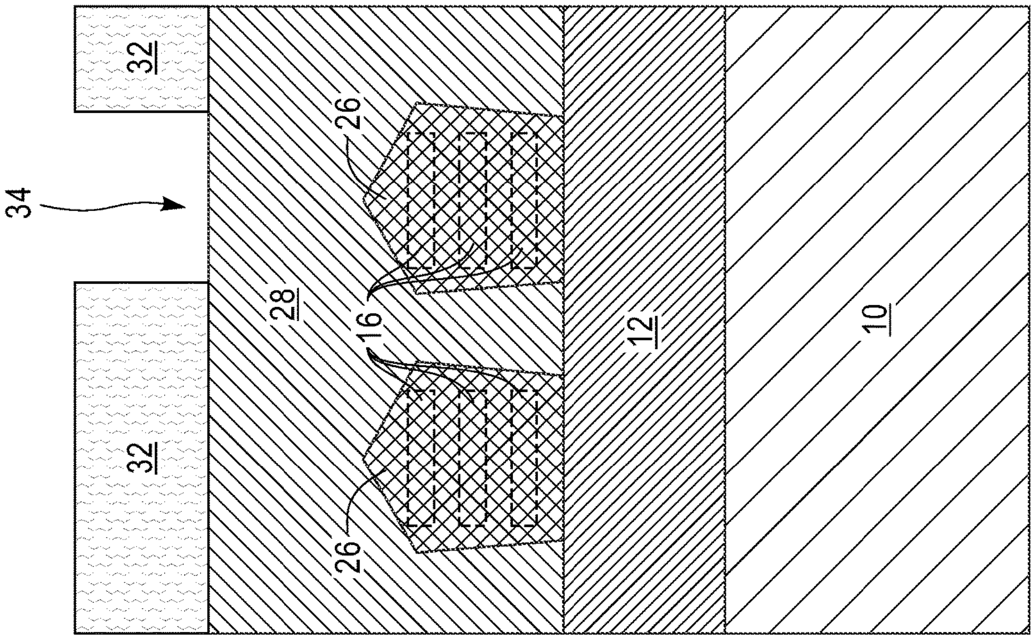
FIGS. 4A-4B are cross sectional views of the exemplary structure shown in FIGS. 3A-3B, respectively, after forming a direct backside contact masking layer having an opening located above one of the source/drain regions.
Figure 4A:
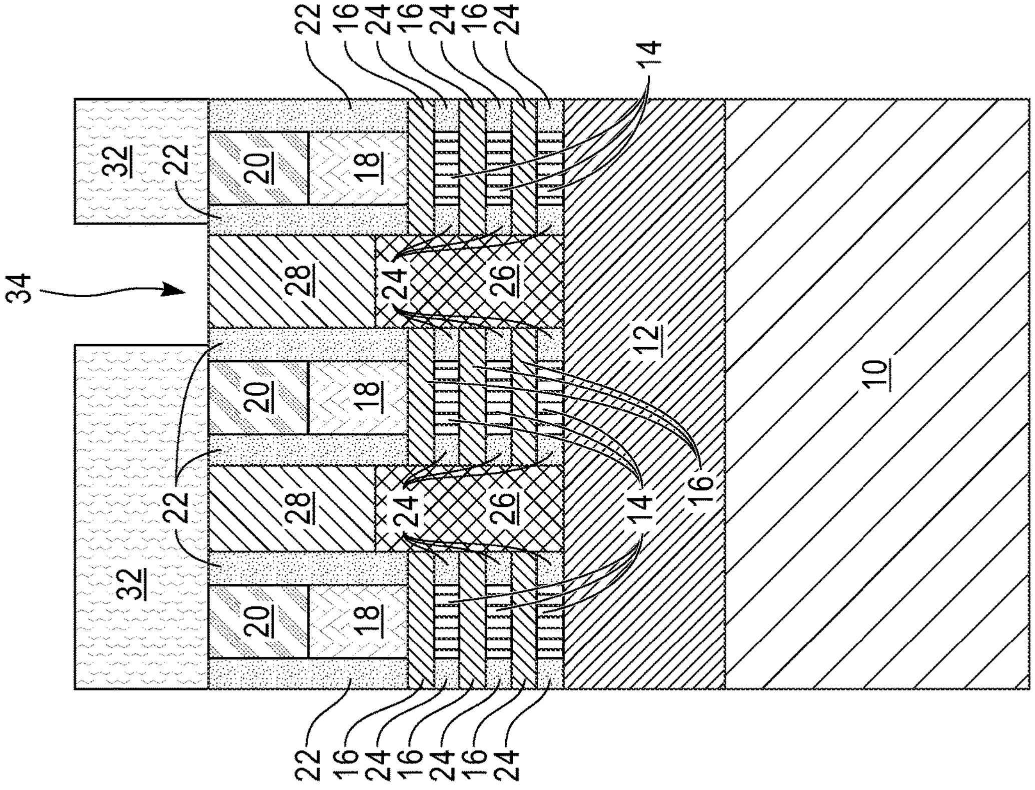

Referring now to FIGS. 4A-4B, there are illustrated the exemplary structure shown in FIGS. 3A-3B, respectively, after forming a direct backside contact masking layer 32 having an opening 34 located above one of the source/drain regions 26. The direct backside contact masking layer 32 is composed of any conventional masking material or a combination of such masking materials. In one example, the direct backside contact masking layer 32 is composed of an organic planarization material. The direct backside contact masking layer 32 can be formed by deposition (e.g., CVD, PECVD, spin-on coating or any combination thereof) of a masking material or a combination of masking materials, followed by lithography and etching. The etch creates opening 34 in the as-deposited masking material or combination of masking materials. The opening 34 physically exposes the frontside ILD layer 28 that is located directly above one of the source/drain regions 26. The direct backside contact masking layer 32 is employed in the present application in defining the area in which the backside wrap around contact of the present application will be subsequently formed.

Figure 5B:
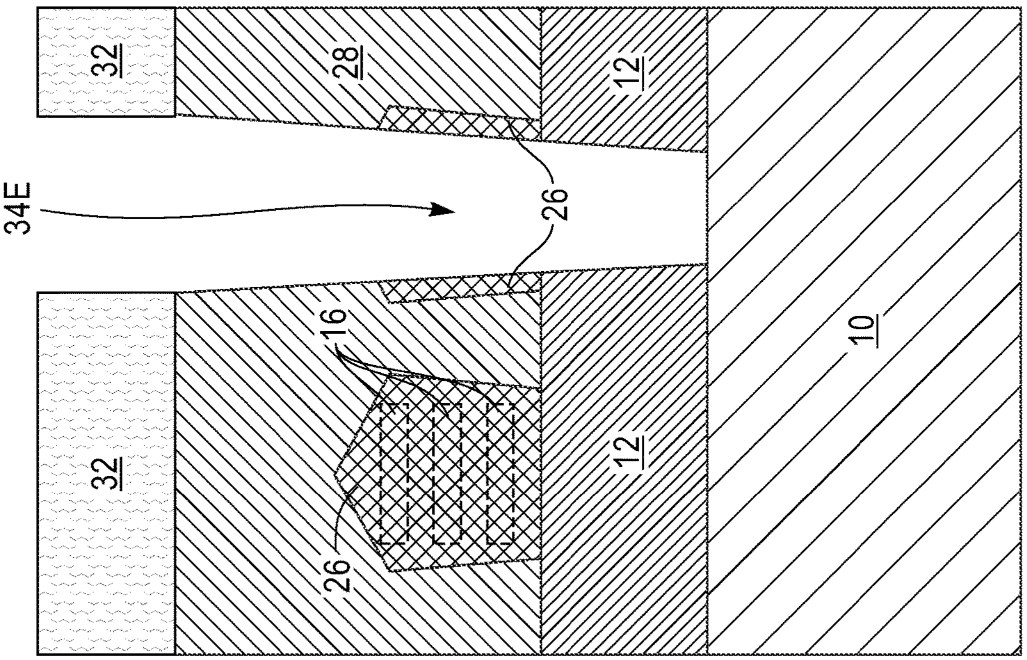
FIGS. 5A-5B are cross sectional views of the exemplary structure shown in FIGS. 4A-4B, respectively, after performing a direct backside contact etch entirely through each of the frontside ILD layer, one of the source/drain regions and the dielectric layer.
Figure 5A:
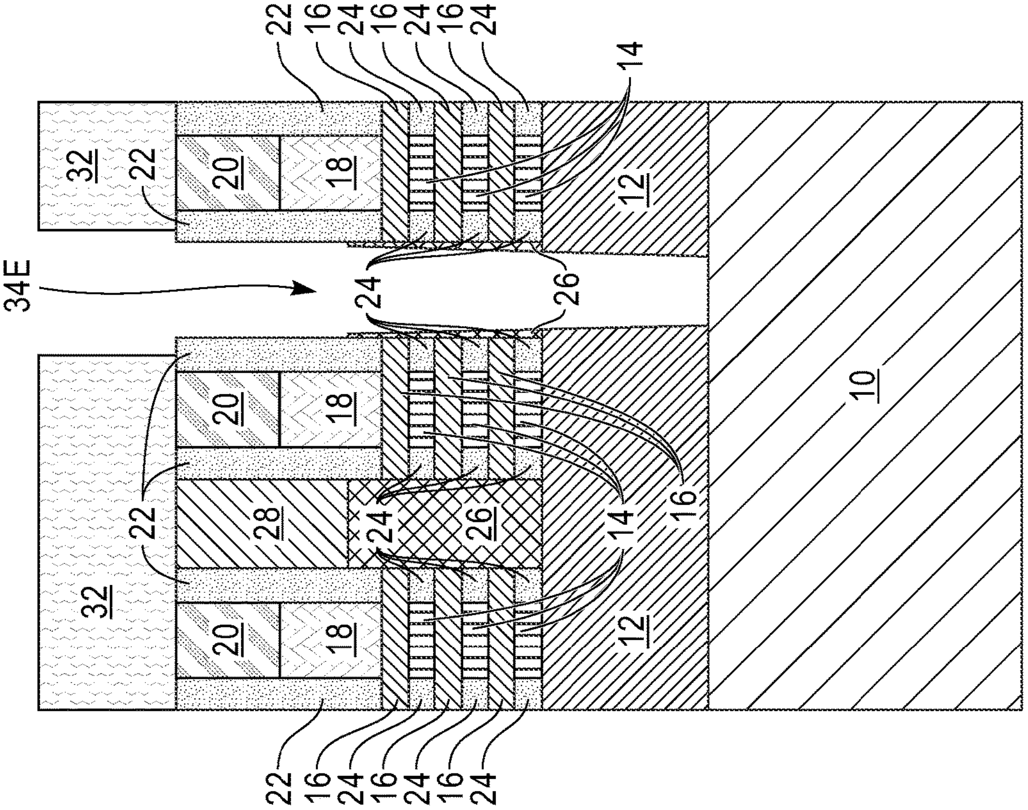

Referring now to FIGS. 5A-5B, there are illustrated the exemplary structure shown in FIGS. 4A-4B, respectively, after performing a direct backside contact etch entirely through the frontside ILD layer 28, one of the source/drain regions 26 and the dielectric layer 12. The direct backside contact etch forms a direct backside contact opening 34E that physically exposes a surface of the semiconductor base layer 10. In the illustrated embodiment, the direct backside contact opening 34E stops on a topmost surface of the semiconductor base layer 10. In some embodiments and depending on the width of the opening 34 that is present in the direct backside contact masking layer 32 (and the nature of the etchant), the direct backside contact etch can remove an entirety of one of the source/drain regions 26, or it can partially remove one of the source/drain regions 26 leaving a remaining portion of the source/drain region 26 on each side (or only one side) of the direct backside contact opening 34E. The remaining portions of the source/drain regions 26 are in physical contact with the semiconductor channel material nanosheets 16 that are present on each side of the direct backside contact opening 34E. The remaining portion of the source/drain regions 26 can serve as a nucleation surface for subsequent growth of the source/drain trench structure 36. The direct backside contact etch can include RIE.

Figure 6B:
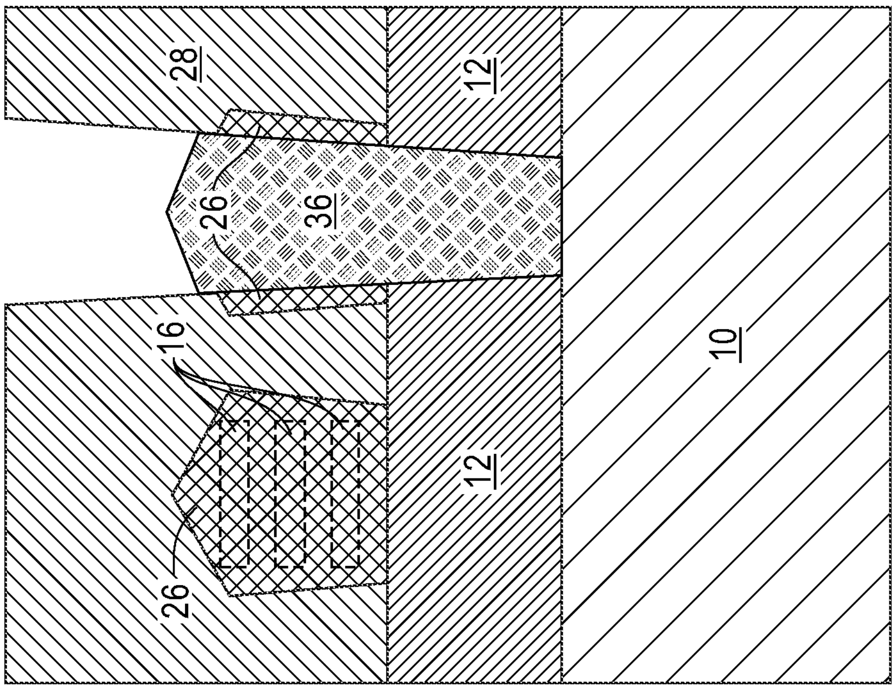
FIGS. 6A-6B are cross sectional views of the exemplary structure shown in FIGS. 5A-5B, respectively, after forming a source/drain trench structure.
Figure 6A:
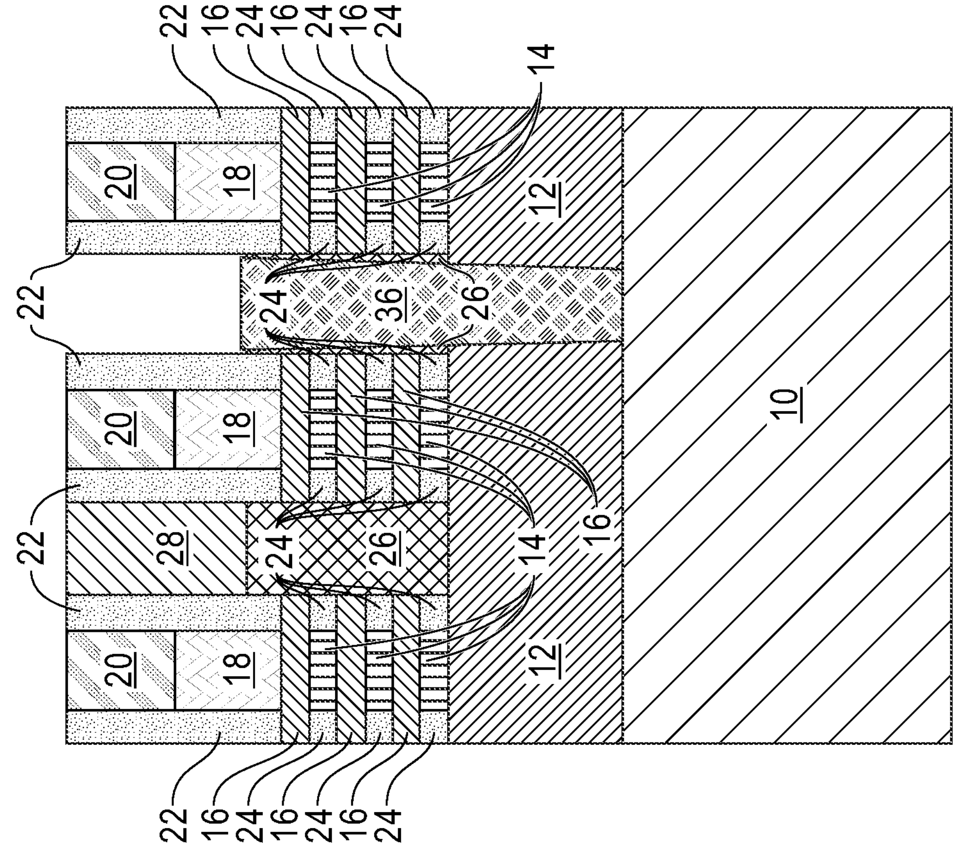

Referring now to FIGS. 6A-6B, there are illustrated the exemplary structure shown in FIGS. 5A-5B, respectively, after forming the source/drain trench structure 36 in the direct backside contact opening 34E. The direct backside contact masking layer 32 can be removed prior to, or after, the forming of the source/drain trench structure 36 utilizing any material removal process that is selective in removing the direct backside contact masking layer 32. The source/drain trench structure 36 is composed of a fifth semiconductor material and a same conductivity type dopant as the dopant present in the source/drain regions 26. The fifth semiconductor material can be compositionally the same as, or compositionally different from, the first semiconductor material that provides the semiconductor base layer 10 and/or the third semiconductor material that provides the semiconductor channel material nanosheets 16 and/or the fourth semiconductor material that provides the source/drain regions 26. The source/drain trench structure 36 is formed utilizing an epitaxial growth process utilizing at least the semiconductor base layer 10 as a growth surface. In some embodiments, the portions of the source/drain region 26 which was previously etched and that remain on each side (or only one side) of the direct backside contact opening 34E can be used as a growth surface. In yet other embodiments, and when the direct backside contact etch removes an entirety of the source/drain region 26, a physically exposed sidewall of each of the semiconductor channel material nanosheets 16 can also be used as a growth surface. The source/drain trench structure 36 grows upward much faster than sidewalls thus pinch off is typically avoided. Depending on the width of the direct backside contact opening 34E the source/drain trench structure 36 can have a substantially planar surface as shown in FIG. 6A or a pointy surface as shown in FIG. 6B. In the present application, the source/drain trench structure 36 is either in direct physical contact with a sidewall of each of the semiconductor channel material nanosheets 16, or the source/drain trench structure 36 is indirectly in contact with the semiconductor channel material nanosheets 16 by a remaining portion of the source/drain region 26. The source/drain trench structure 36 has a topmost surface that can be substantially coplanar with, or above, a topmost surface of a topmost semiconductor channel material nanosheet 16. The source/drain trench structure 36 passes through the dielectric layer 12 and has an upper portion located on the frontside of the dielectric layer 12 and a lower portion that is located on the backside of the dielectric layer 12.

Figure 7B:
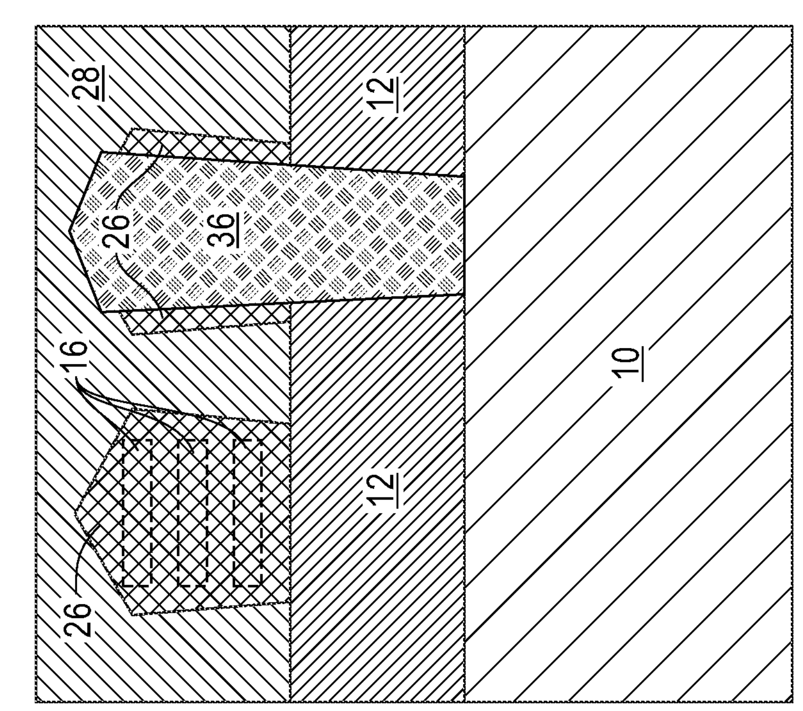
FIGS. 7A-7B are cross sectional views of the exemplary structure shown in FIGS. 6A-6B, respectively, after reforming the frontside ILD layer on top of the source/drain trench structure, reveling a topmost surface of the sacrificial gate structure, and performing a gate cut process.
Figure 7A:
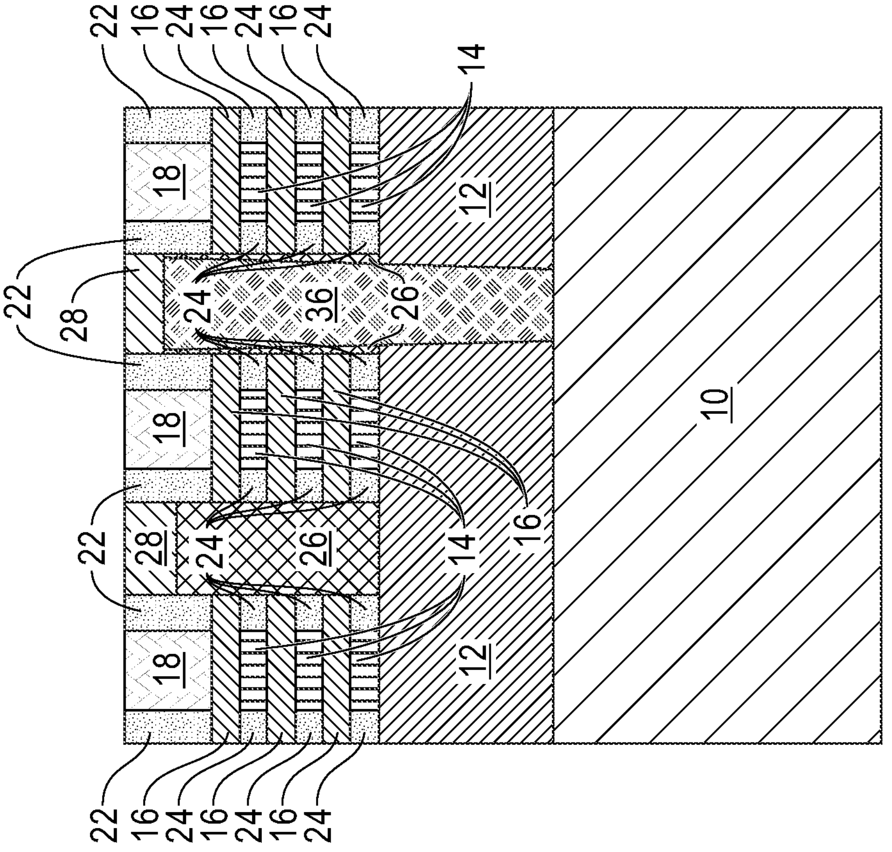

Referring now to FIGS. 7A-7B, there are illustrated the exemplary structure shown in FIGS. 6A-6B, respectively, after reforming the frontside ILD layer 28 on top of the source/drain trench structure 36, reveling a topmost surface of the sacrificial gate structure 18, and performing a gate cut process. The position of the gate cut process is shown in FIG. 1 and is not present in the cross sectional views illustrated in FIGS. 7A-7B. The reforming the frontside ILD layer 28 includes depositing one of the dielectric materials mentioned above for the frontside ILD layer 28 and then performing a planarization process. The planarization process can stop on a topmost surface of the hard mask cap 20 (if the same is present) or on a topmost surface of the sacrificial gate structure 18. Thus, and when the hard mask cap 20 is omitted, the planarization process used in the reforming of the frontside ILD layer 28 reveals the sacrificial gate structure 18. In cases in which a hard mask cap 20 is present, another planarization process can be used to remove the hard mask cap 20 (as well as an upper portion of the gate spacer 22 and an upper portion of the frontside ILD layer 28) to reveal the sacrificial gate structure 18.

The gate cut process includes forming a trench opening into the sacrificial gate structure 18 and then filling this trench opening with a dielectric material to provide a gate cut dielectric material pillar in the gate cut region (See, GC shown in FIG. 1) that extends upward from a surface of the dielectric layer 12. The dielectric material pillar can be composed of SiN, SiOCN, SiBCN, $SiO_2$ or any other like dielectric material. Note that the gate cut process can be delayed and performed after replacing the sacrificial gate structure 18 with a gate structure. In yet other embodiments, the gate cut process can be omitted.

Figure 8B:
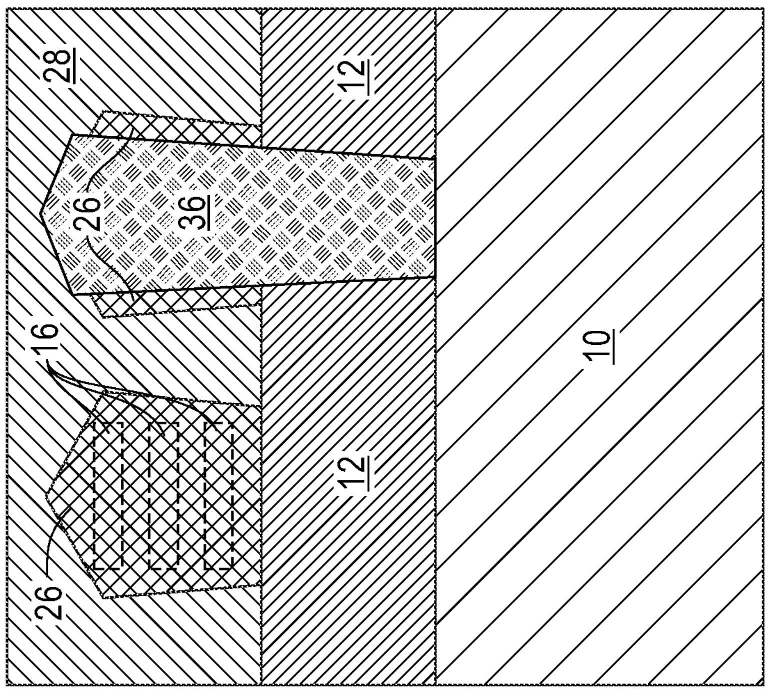
FIGS. 8A-8B are cross sectional views of the exemplary structure shown in FIGS. 7A-7B, respectively, after removing the sacrificial gate structure to reveal the nanosheet stack, removing each sacrificial semiconductor material nanosheet of the revealed nanosheet stack, and forming a gate structure around physically exposed portions of each semiconductor channel material nanosheet.
Figure 8A:
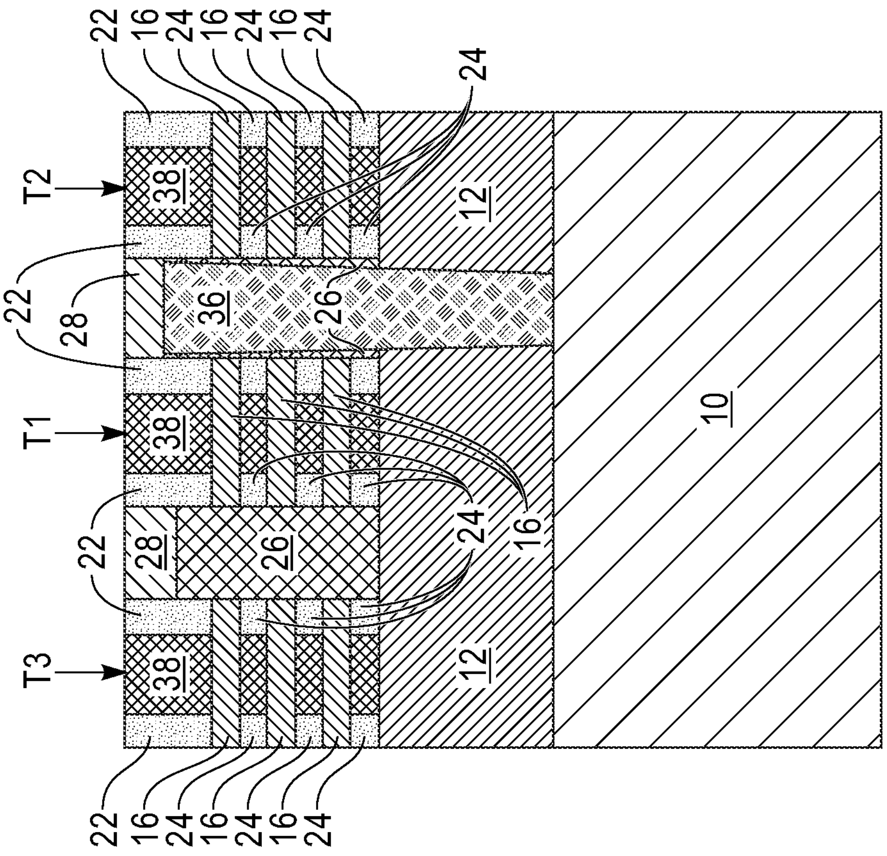

Referring now to FIGS. 8A-8B, there are illustrated the exemplary structure shown in FIGS. 7A-7B, respectively, after removing the sacrificial gate structure 18 to reveal the nanosheet stack, removing each sacrificial semiconductor material nanosheet 14 of the revealed nanosheet stack, and forming a gate structure 38 around physically exposed portions of each semiconductor channel material nanosheet 16. The sacrificial gate structure 18 can be removed utilizing any material removal process such as, for example, etching, which is selective in removing the sacrificial gate structure 18. The removal of the sacrificial gate structure 18 reveals the underlying nanosheet stack. Next, the sacrificial semiconductor material nanosheets 14 are removed so as to suspend a middle portion of each semiconductor channel material nanosheet 16. The removal of the sacrificial semiconductor material nanosheets 14 includes any material removal process such as, for example, etching, which is selective in removing the sacrificial semiconductor material nanosheets 14.

The gate structure 38 is then formed. The gate structure 38 includes a gate dielectric material and a gate electrode, both of which are not separately shown, but intended to be within region defined by the gate structure 38. As is known to those skilled in the art, the gate dielectric material directly contacts a physically exposed surface(s) of the semiconductor channel region (e.g., each semiconductor channel material nanosheet 16), and the gate electrode is formed on the gate dielectric material. The gate dielectric material has a dielectric constant of 4.0 or greater. Illustrative examples of gate dielectric materials include, but are not limited to, silicon dioxide, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb ($Sc,Ta)O_3$), and/or lead zinc niobite (Pb(Zn,Nb)O). The gate dielectric material can further include dopants such as lanthanum (La), aluminum (Al) and/or magnesium (Mg).

The gate electrode can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate structure 38 can be formed by deposition of the gate dielectric material, and gate electrode material, followed by a planarization process. At this point of the present application, the gate structure 38 has a topmost surface that is coplanar with a topmost surface of the frontside ILD layer 28. In the illustrated embodiment, three transistors, T1, T2 and T3 are formed. The numbering of the transistors is arbitrary and is used herein as a means for designating which of the transistors will be processed to include the backside wrap around contact structure. As is illustrated, the gate structure 38 of each of the transistors is located on a surface of the dielectric layer 12. Also, and as is illustrated in FIG. 8A, T1 includes only source/drain region 26 on a first side (i.e., first source/drain area of T1) of the gate structure 38 and at least source/drain trench structure 36 on a second side (i.e., second source/drain area of T1) of the gate structure 38, the second side is opposite the first side.

Figure 9B:
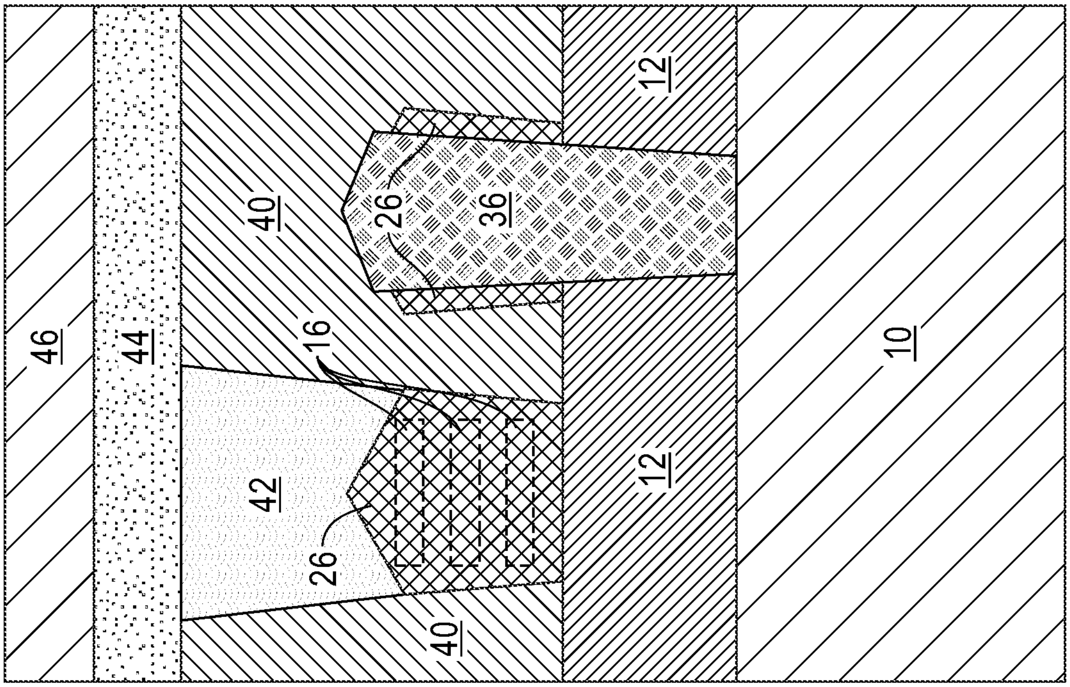
FIGS. 9A-9B are cross sectional views of the exemplary structure shown in FIGS. 8A-8B, respectively, after forming additional ILD material, frontside contacts, a frontside back-end-of-the-line (BEOL) structure, and a carrier wafer.
Figure 9A:
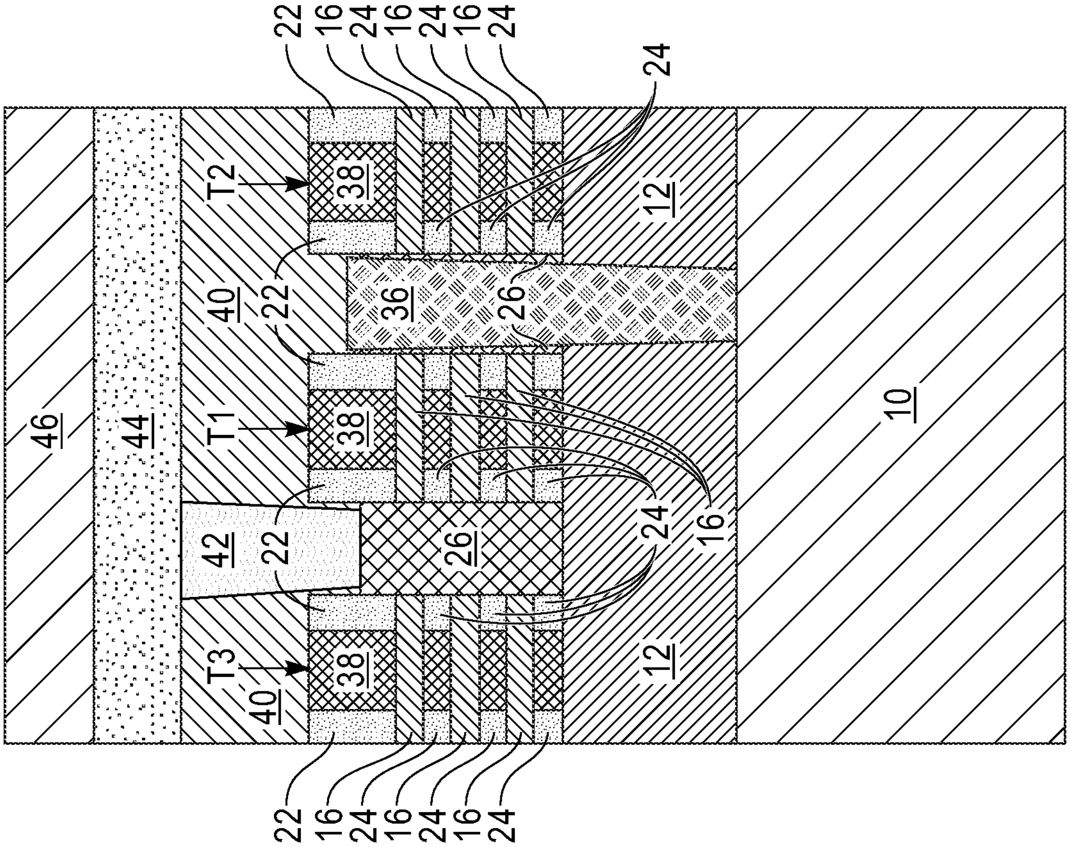

Referring now to FIGS. 9A-9B, there are illustrated the exemplary structure shown in FIGS. 8A-8B, respectively, after forming additional ILD material, frontside contacts, a frontside BEOL structure 44, and a carrier wafer 46. In the present application, the additional frontside ILD layer and the frontside ILD layer 28 collectively provide a middle-of-the-line (MOL) dielectric layer 40. The additional frontside ILD layer can be composed of a dielectric material that is compositionally the same as, or compositionally different from, the dielectric material that provides the frontside ILD layer 28. Typically, the dielectric material that provides the additional ILD layer is compositionally the same as the dielectric material that provides the frontside ILD layer 28 such that within the MOL dielectric layer 40 no material interface would exist between the additional frontside ILD layer and the frontside ILD layer 28; such an embodiment is shown in the drawings of the present application. When compositionally different dielectric materials are employed for the additional frontside ILD layer and the frontside ILD layer 28, the MOL dielectric layer 40 would contain a material interface between the two compositionally different dielectric materials. Such an embodiment is not however shown in the drawings of the present application. The additional frontside ILD layer can be formed utilizing one of the deposition processes mentioned above in forming the frontside ILD layer 28.

Frontside contact structures including a frontside source/drain contact structure 42 and typically a frontside gate contact structure (not shown for clarity) are then formed utilizing a metallization process that includes forming frontside contact openings in the MOL dielectric layer 40, and thereafter filling (including deposition and planarization) each frontside contact opening with at least a contact conductor material. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside contact structures can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above. The frontside source/drain contact structure 42 contacts the source/drain region 26 that was not previously subjected to the direct backside contact etch. The frontside gate contact structure would contact a surface of a gate electrode of the gate structure 38. Each frontside contact structure (including the frontside source/drain contact structure 42) has a topmost surface that is substantially coplanar with a topmost surface of the MOL dielectric layer 40. The frontside source/drain contact structure 42, the frontside gate contact structure and MOL dielectric layer 40 represent a MOL level that is located on a frontside of the illustrated structure.

Frontside BEOL structure 44 is then formed on the MOL level. In the illustrated embodiment, the frontside BEOL structure 44 is electrically connected to the source/drain region 26 of the gate structure 38 of the first transistor T1 by frontside source/drain contact structure 42 (frontside BEOL structure 44 would also be typically electrically connected to the gate structure 38 of the first transistor T1 via a frontside gate contact structure). The frontside BEOL structure 44 can include one or more interconnect dielectric material layers (including one of the dielectric materials mentioned above for the frontside ILD layer 28) that contain frontside metal wires (the metal wires can be composed of any electrically conductive metal or electrically conductive metal alloy) embedded therein. The frontside BEOL structure 44 can include "x" numbers of frontside metal levels, wherein "x" is an integer starting from 1. The frontside BEOL structure 44 can be formed utilizing techniques well known to those skilled in the art. In some embodiments, the frontside metal wires in the frontside BEOL structure 44 are composed of Cu.

The carrier wafer 46 can include one of the first semiconductor materials mentioned above for the semiconductor base layer 10. Carrier wafer 46 is bonded to the frontside BEOL structure 44 after frontside BEOL structure 44 formation. The carrier wafer 46 is typically removed from the structure after backside processing of the structure is completed. Frontside processing has now be completed and the exemplary structure is ready for backside processing.

Figure 10B:
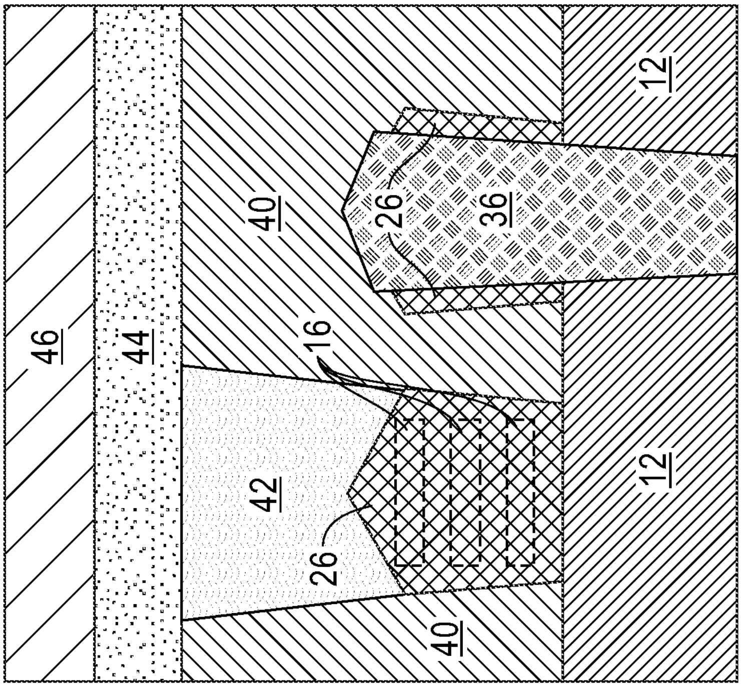
FIGS. 10A-10B are cross sectional views of the exemplary structure shown in FIGS. 9A-9B, respectively, after flipping the structure and removing a semiconductor base layer of the substrate to physically expose the dielectric layer.
Figure 10A:
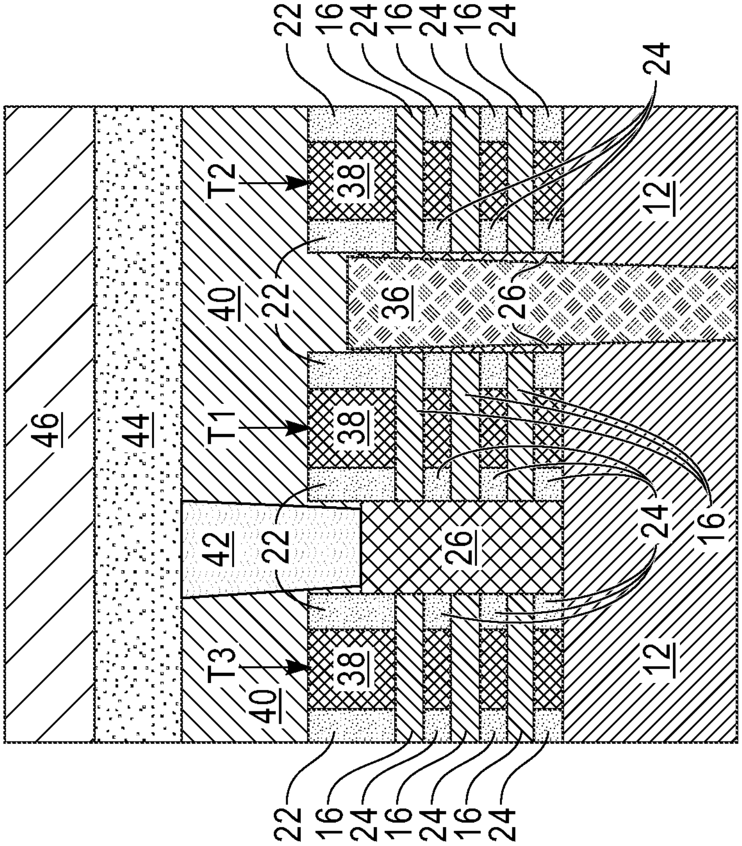

Referring now to FIGS. 10A-10B, there are illustrated the exemplary structure shown in FIGS. 9A-9B, respectively, after flipping the structure and removing semiconductor base layer 10 of the substrate to physically expose the dielectric layer 12. In the present application, the structure shown in FIGS. 9A-9B is flipped 180° to physically expose a backside of the substate. This flipping step is not shown in the drawings of the present application for clarity. This flipping step will allow backside processing of the exemplary structure. Backside processing occurs on a side of a substrate (or wafer) opposite the side where the transistors, e.g., T1, T2 and T3, have been formed; in the present application the backside of the substrate can be defined as the area of the substrate that is beneath the dielectric layer 12. Flipping of the structure can be performed by hand or by utilizing a mechanical means such as, for example, a robot arm. The removal of the physically exposed semiconductor base layer 10 can be performed utilizing a material removal process that is selective in removing the first semiconductor material that provides the semiconductor base layer 10.

Figure 11B:
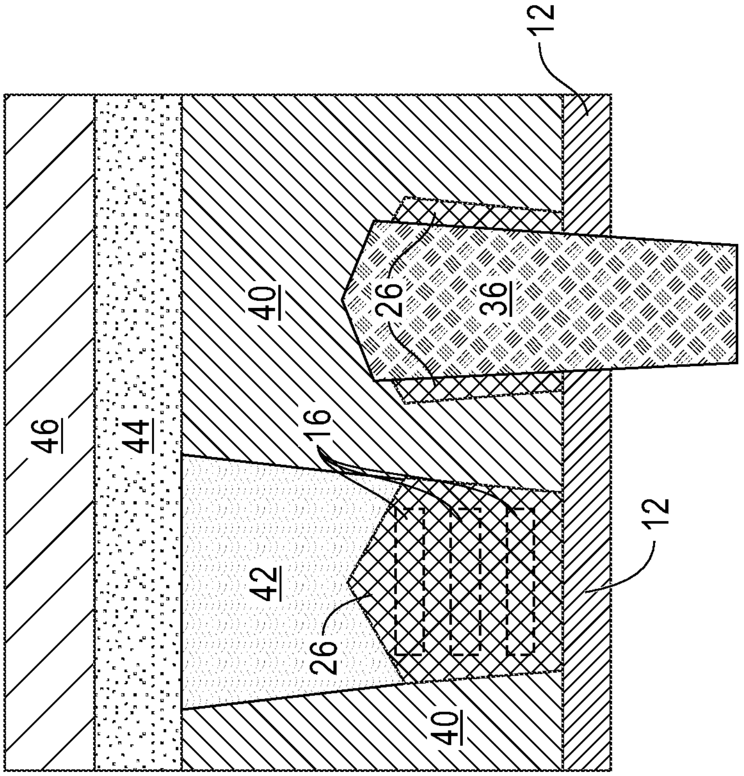
FIGS. 11A-11B are cross sectional views of the exemplary structure shown in FIGS. 10A-10B, respectively, after recessing the physically exposed dielectric layer to reveal a lower portion of the source/drain trench structure.
Figure 11A:
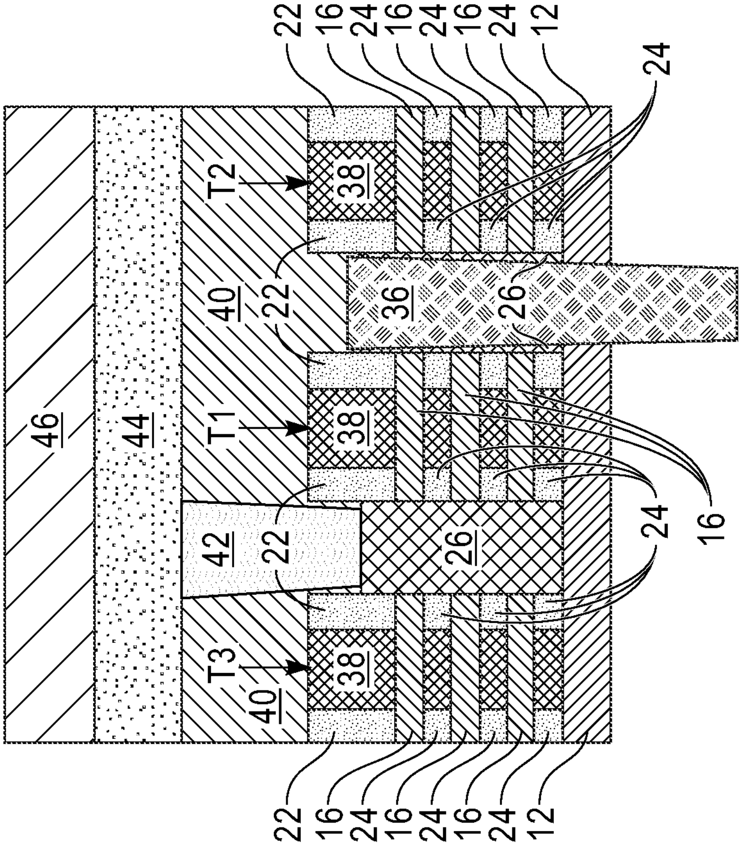

Referring now to FIGS. 11A-11B, there are illustrated the exemplary structure shown in FIGS. 10A-10B, respectively, after recessing the physically exposed dielectric layer 12 to reveal a lower portion of the source/drain trench structure 36. In the present application, the dielectric layer 12 has a first thickness, and after the recessing step, the dielectric layer 12 that remains has a second thickness that is less than the first thickness. The recessing includes a recess etch that is selective in removing the dielectric material that provides the dielectric layer 12; the recess etch does not remove any substantial portion of the source/drain trench structure 36. In the present application, at least 10%, more typically 20%, and even more typically from 25% to 50% of the source/drain trench structure 36 is physically exposed after the recessing of the dielectric layer 12. The physically exposed lower portion of the source/drain trench structure 36 is located beneath (and is thus on the backside of) the dielectric layer 12.

Figure 12B:
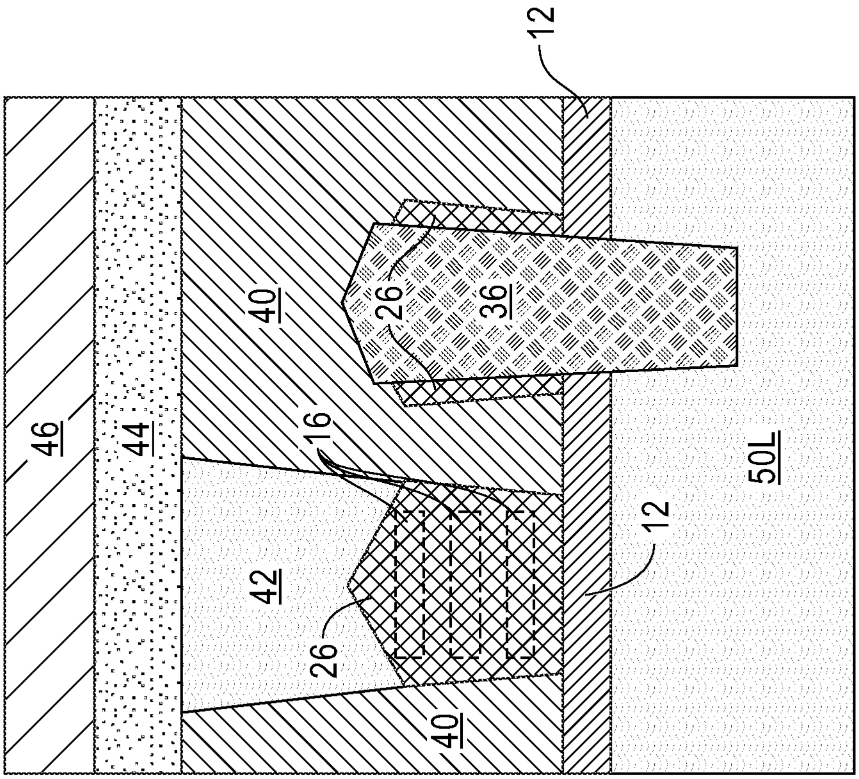
FIGS. 12A-12B are cross sectional views of the exemplary structure shown in FIGS. 11A-11B, respectively, after forming a contact metal-containing layer to embed the revealed lower portion of the source/drain trench structure.
Figure 12A:
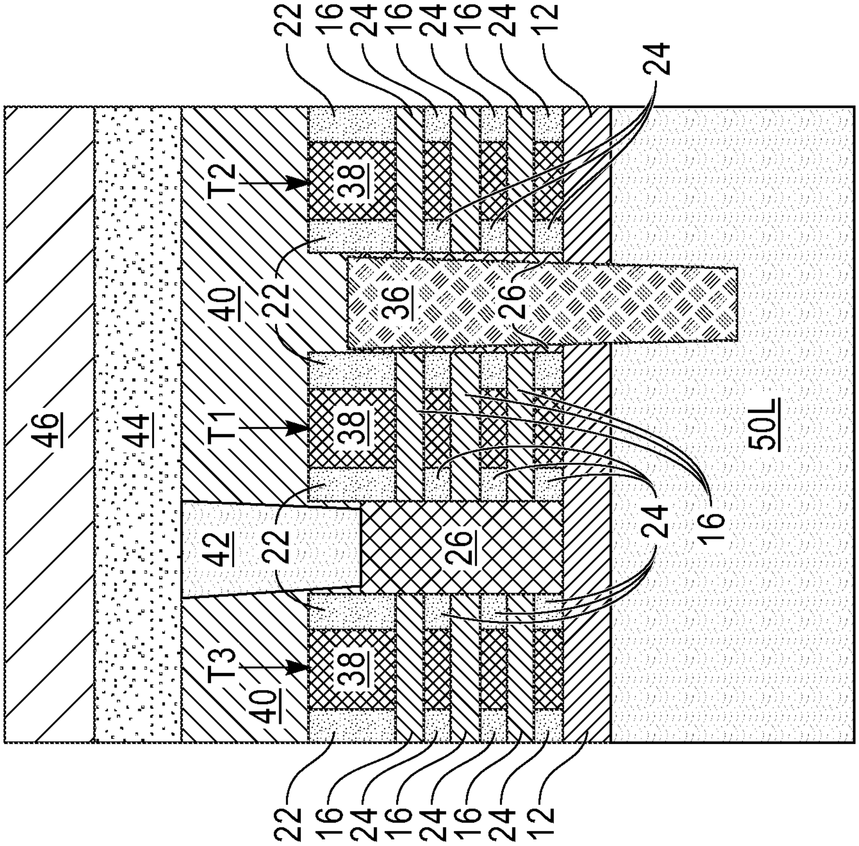

Referring now to FIGS. 12A-12B, there are illustrated the exemplary structure shown in FIGS. 11A-11B, respectively, after forming a contact metal-containing layer 50L to embed the revealed lower portion of the source/drain trench structure 36. The contact metal-containing layer 50L forms an interface with the dielectric layer 12, and an interface with the physically exposed lower portion of the source/drain trench structure 36. Notably, contact metal-containing layer 50L forms an interface with each sidewall and a bottommost surface of the physically exposed lower portion of the source/drain trench structure 36. The contact metal-containing layer 50L includes a contact conductor material as defined above for the frontside contact structures. The contact metal-containing layer 50L can be formed by a deposition process such as, for example, CVD, PECVD, PVD, ALD, sputtering or plating. Before forming the contact metal-containing layer 50L, various implantation processes, such as, for example, B or Ga implantation for PFETs, P or As implantation for NFETs, or Ge or Si amorphization implantation can be performed with different angles to cover not only the bottom surface, but also the sidewall surface of the source/drain trench structure 36. A subsequent nanosecond laser anneal or other activation anneal follows the implantation mentioned above. The aforementioned implants and the activation anneal ensure low contact resistance between the contact metal-containing layer 50L and the source/drain trench structure 36 at the bottom and sidewall surfaces.

Figure 13B:
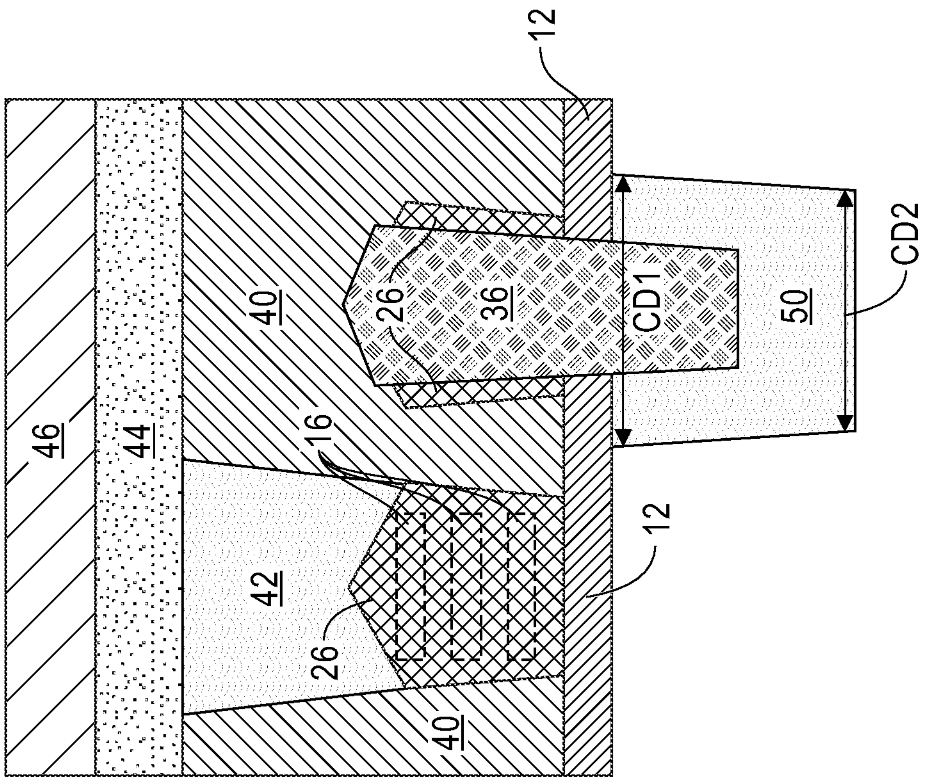
FIGS. 13A-13B are cross sectional views of the exemplary structure shown in FIGS. 12A-12B, respectively, after performing a subtractive etch on the contact metal-containing layer to provide a backside wrap around contact structure.
Figure 13A:
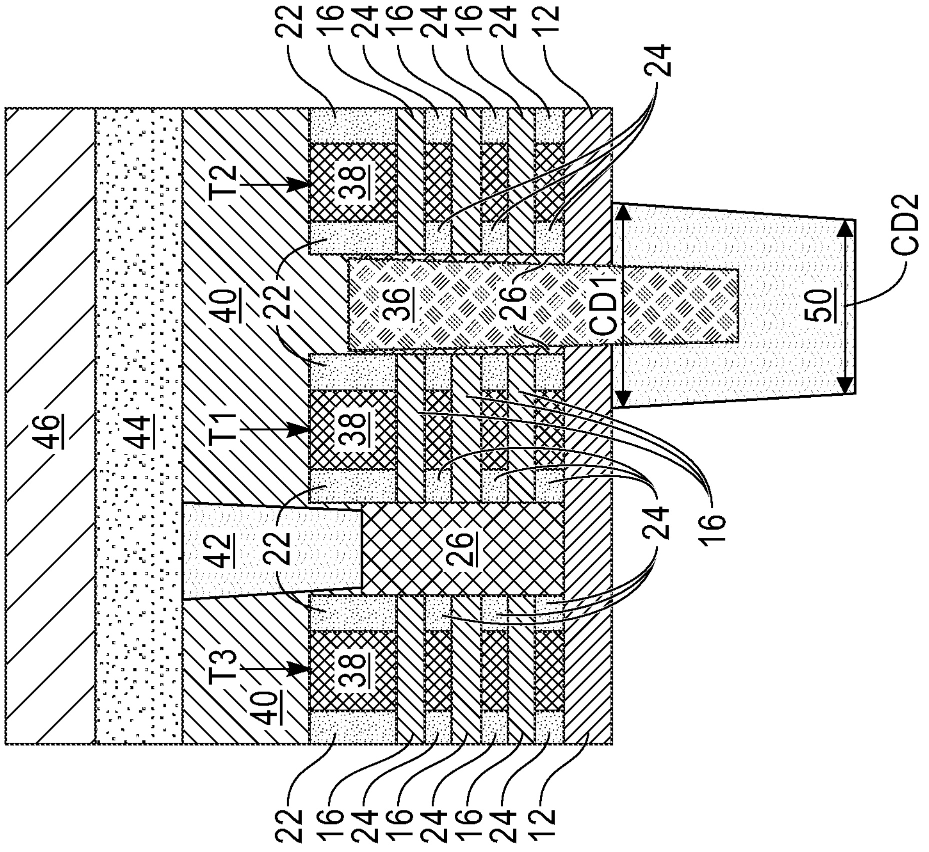

Referring now to FIGS. 13A-13B, there are illustrated the exemplary structure shown in FIGS. 12A-12B, respectively, after performing a subtractive etch on the contact metal-containing layer 50L to provide a backside wrap around contact structure 50. The substrative etch includes lithography and etching (e.g., RIE). The etching is selective in removing contact conductor material that is not protected by a patterned masking layer. The backside wrap around contact structure 50 forms an interface with the dielectric layer 12, and an interface with the physically exposed lower portion of the source/drain trench structure 36. Notably, backside wrap around contact structure 50 forms an interface with each sidewall and bottommost surface of the physically exposed lower portion of the source/drain trench structure 36.

In embodiments of the present application, the backside wrap around contact structure 50 has an upper portion (i.e., the topmost surface that is nearest dielectric layer 12) having a first critical dimension, CD1, and a lower portion (i.e., the bottommost) having a second critical dimension CD2 in which CD2 is larger than CD1.

Figure 14B:
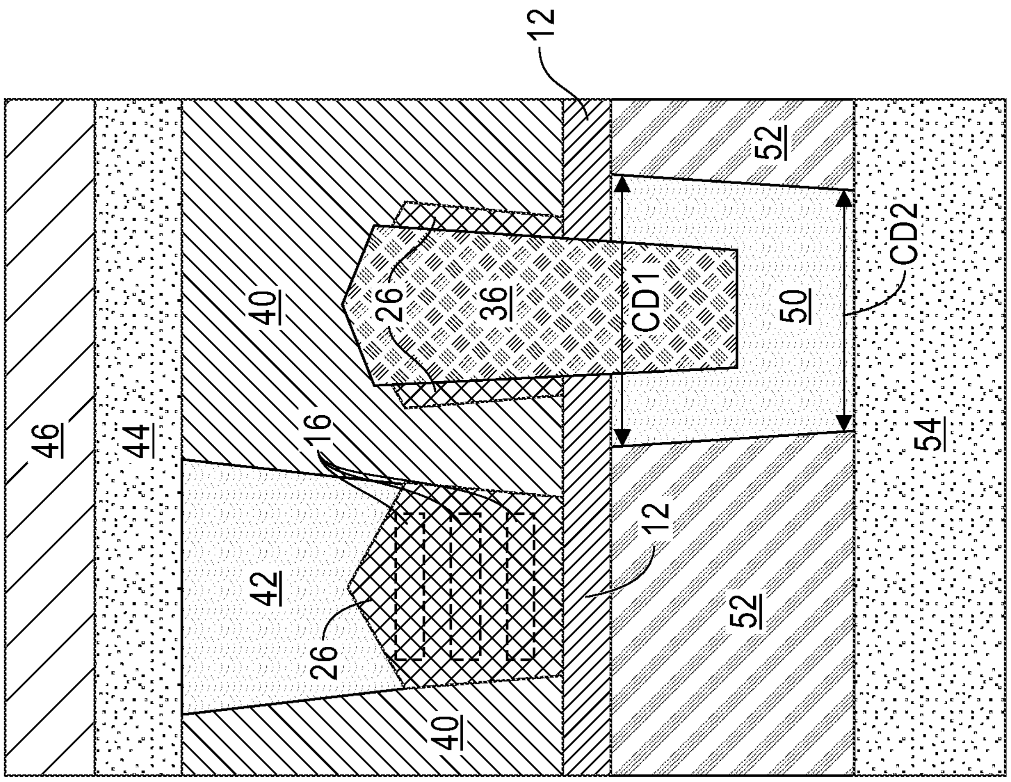
FIGS. 14A-14B are cross sectional views of the exemplary structure shown in FIGS. 13A-13B, respectively, after forming a backside ILD layer and a backside interconnect structure.
Figure 14A:
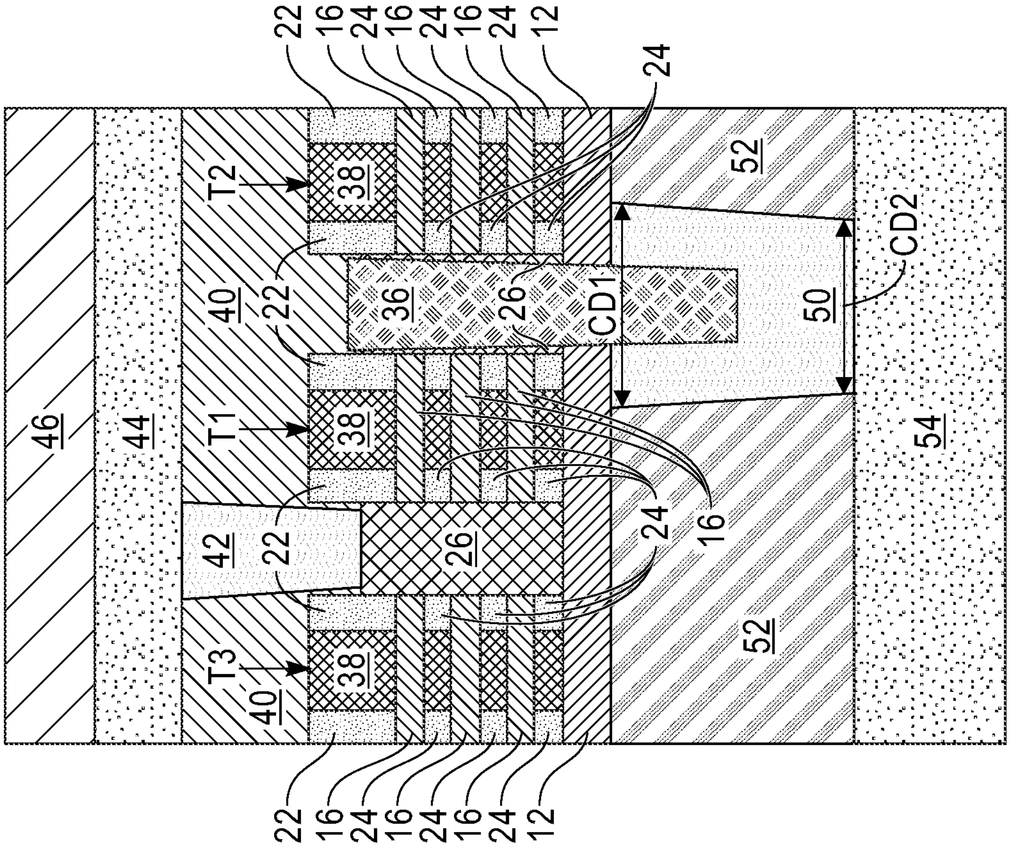

Referring now to FIGS. 14A-14B, there are illustrated the exemplary structure shown in FIGS. 13A-13B, respectively, after forming a backside ILD layer 52 and a backside interconnect structure 54. The backside ILD layer 52 can include one of the dielectric materials mentioned above for the frontside ILD layer 28. The backside ILD layer 52 can be formed utilizing one of the deposition processes mentioned above for forming the frontside ILD layer 28. A planarization process can follow the deposition process used in forming the backside ILD layer 52. The planarization process stops on a surface of the backside wrap around contact structure 50. The backside ILD layer 52 contacts the dielectric layer 12 and embeds the backside wrap around contact structure 50 as shown in FIGS. 14A-14B.

The backside interconnect structure 54 can include one or more interconnect dielectric material layers that contain backside metal wires (the backside metal wires can be composed of any electrically conductive metal or electrically conductive metal alloy) embedded therein. The backside interconnect structure 54 can include "y" numbers of backside metal levels, wherein "y" is an integer starting from 1. The backside interconnect structure 54 can be formed utilizing techniques well known to those skilled in the art. In some embodiments, the backside metal wires within the backside interconnect structure 54 are composed of Cu. The backside interconnect structure 54 is electrically connected to the source/drain trench structure 36 of the first transistor T1 via the backside wrap around contact structure 50.

FIGS. 14A-14B illustrates a semiconductor device in accordance with the present application. The semiconductor device includes a transistor (e.g., T1) that is located on a frontside of dielectric layer 12. The transistor (e.g., T1) includes source/drain region 26 located on a first side of gate structure 38 and source/drain trench structure 36 located on a second side of gate structure 38 that is opposite the first side. The source/drain trench structure 36 extends through the dielectric layer 12, has an upper portion located on the frontside of the dielectric layer 12, and a lower portion located on the backside of the dielectric layer 12. The semiconductor device further includes backside wrap around contact structure 50 that physically contacts, and wraps around, the lower portion of the source/drain trench structure 36. In this embodiment, there is direct physical contact between the backside wrap around contact structure 50 and the dielectric layer 12. Also, the backside wrap around contact structure 50 has a topmost surface that is lower than a bottommost surface of the gate structure 38. The combination of the backside wrap around contact structure 50 and the source/drain trench structure 36 provides a semiconductor device that has an increased contact area, yet since the backside wrap around contact structure 50 is isolated from the gate structure 38 by the dielectric layer 12 no significant increase in backside source/drain contact-to-gate capacitance is observed. The presence of the dielectric layer 12 not only provides isolation between the backside wrap around contact structure 50 and the gate structure 38, but it does not significantly increase the capacitance between the backside wrap around contact structure 50 and the gate structure 38, because as shown in FIG. 14A, the backside wrap around contact structure 50 is completely under the gate structure 38, and there is no horizontal overlap (not like frontside source/drain contact structure 42, it has some horizontal overlap portion to the gate structure 38). It is noted that the source/drain trench structure 36 of this embodiment can be substituted with a surface area enhanced source/drain trench structure 37 (described herein below) or an inner cavity-containing source/drain trench structure 36A (also described herein below).

Figure 20B:
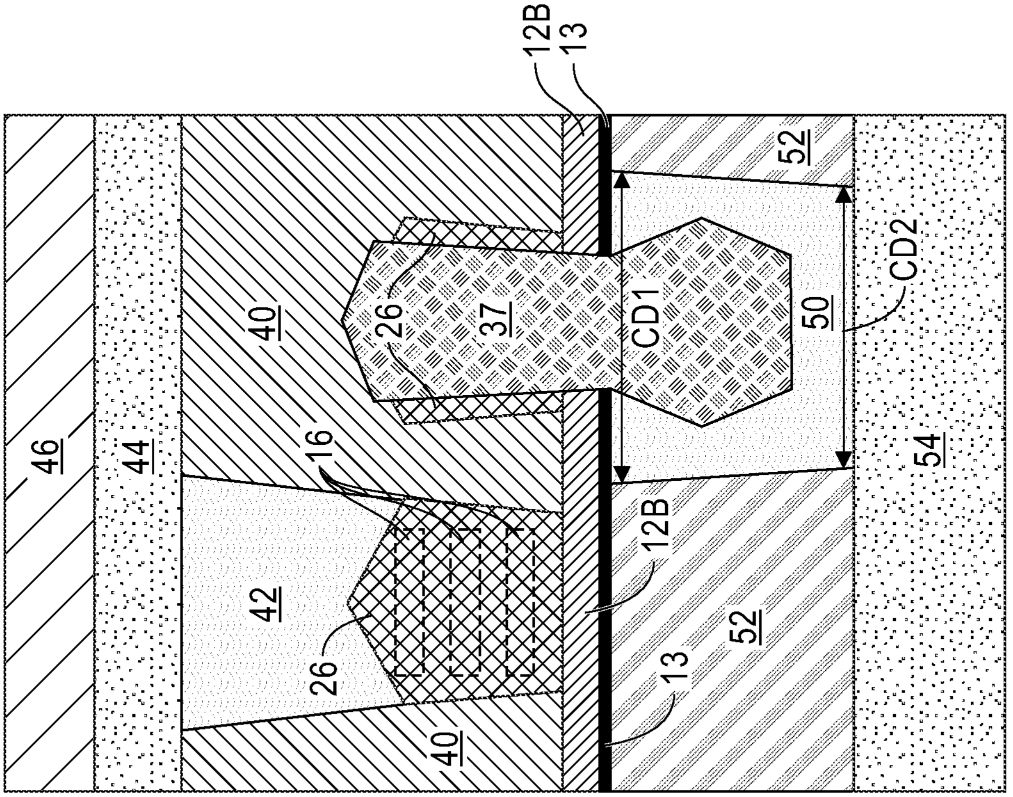
FIGS. 20A-20B are cross sectional views of the exemplary structure shown in FIGS. 19A-19B, respectively, after forming a backside wrap around contact structure contacting the enlarged surface area of the lower portion of the source/drain trench structure, forming a backside ILD layer, and forming a backside interconnect structure.
Figure 20A:
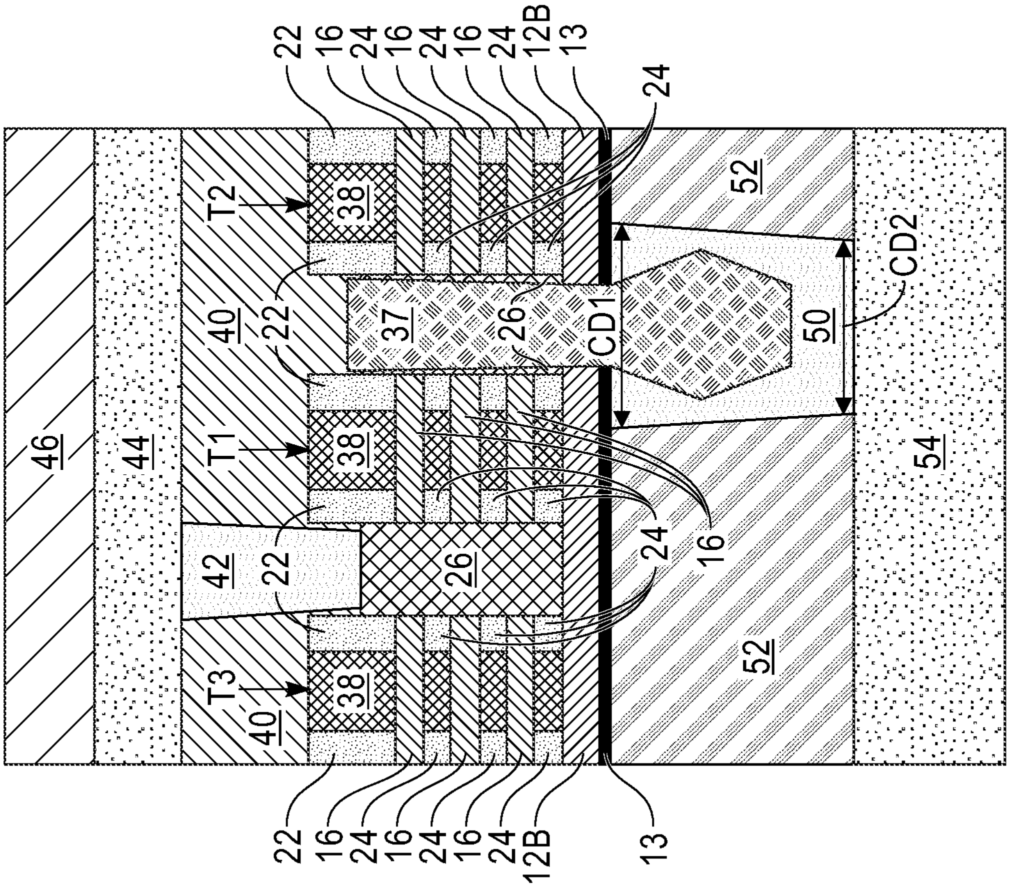

In some embodiments (See, for example, the surface area enhanced source/drain trench structure 37 illustrated in FIGS. 20A-20B), the lower portion of the source/drain trench structure is diamond-shaped. The diamond-shaped modification to the source/drain trench structure increases the overall contact area of the source/drain trench structure, which in turn further reduces the contact resistance.

Figure 24B:
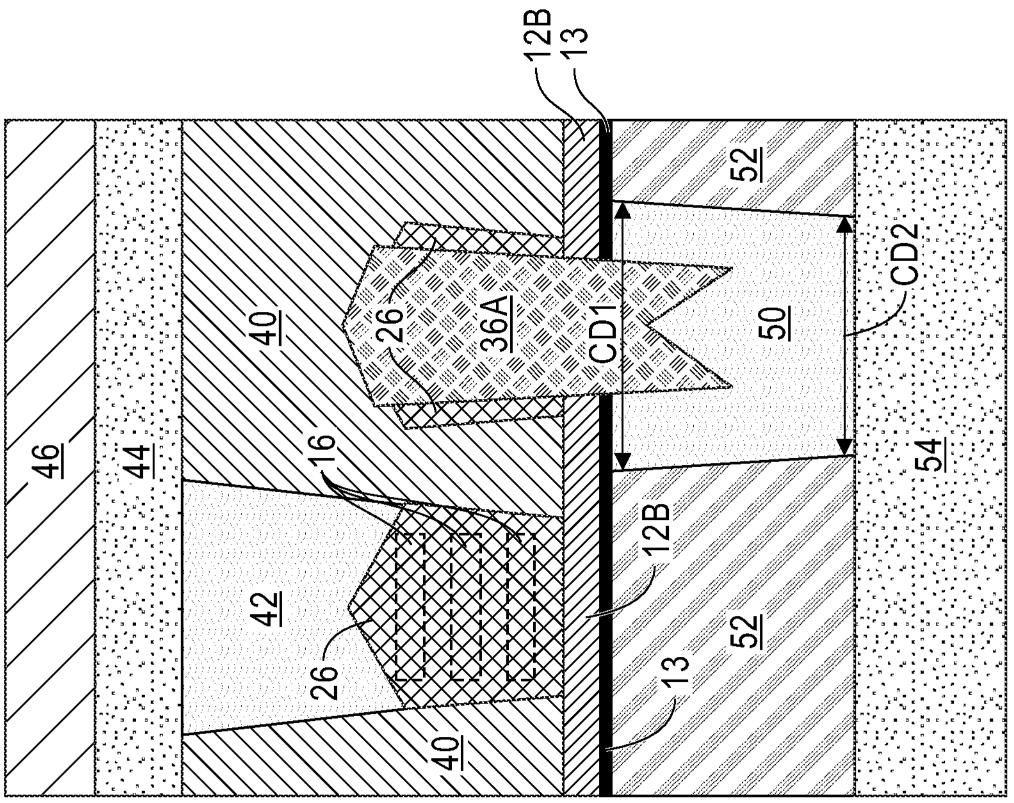
FIGS. 24A-24B are cross sectional views of the exemplary structure shown in FIGS. 23A-23B, respectively, after forming a backside wrap around contact structure contacting the lower portion of the inner cavity-containing source/drain trench structure, forming a backside ILD layer, and forming a backside interconnect structure.
Figure 24A:
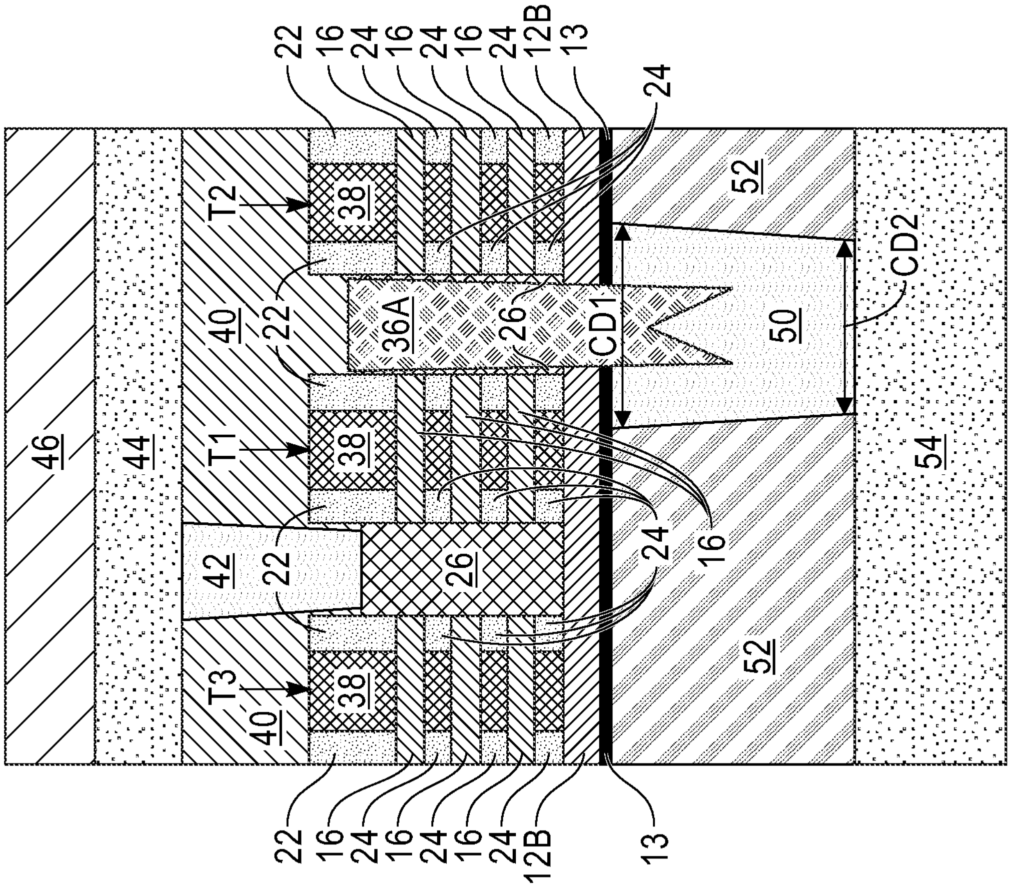

In some embodiments (See, for example, the inner cavity-containing source/drain trench structure 36A illustrated in FIGS. 24A-24B), the lower portion of the source/drain trench structure has an inner cavity with angled surfaces S1, and the backside wrap around contact structure 50 is in direct contact with the angled surfaces S1 of the inner cavity. The inclusion of an inner cavity to the source/drain trench structure increases the overall contact area of the source/drain trench structure, which in turn further reduces the contact resistance.

In some embodiments of the present application, the upper portion of the source/drain trench structure 36 is in direct physical contact with a semiconductor channel region (i.e., the semiconductor channel material nanosheets 16) of the transistor.

In some embodiments of the present application (See, for example, FIG. 14A), the upper portion of the source/drain trench structure 36 is in contact with a semiconductor channel region (i.e., the semiconductor channel material nanosheets 16) of the transistor via a portion of a source/drain region 26 that is present on the second side of the gate structure 38. This ensures that the backside wrap around contact structure 50 has no horizontal overlap with the gate structure 38.

In some embodiments of the present application (See, for example, FIGS. 14A-14B), the device further includes frontside BEOL interconnect structure 44 located above the transistor. In such an embodiment, the source/drain region 26 on the first side of the gate structure 38 is in electrical contact with the frontside BEOL interconnect structure 44 by frontside source/drain contact structure 42. In the present application, most of the signals are routed to the frontside BEOL interconnect structure 44.

In some embodiments of the present application (See, for example, FIGS. 14A-14B), backside interconnect structure 54 contacts the backside wrap around contact structure 50.

In some embodiments of the present application (See, for example, FIGS. 14A-14B), the backside wrap around contact structure 50 has an upper portion having a first critical dimension CD1 and a lower portion having a second critical dimension CD2 in which CD2 is larger than CD1.

In some embodiments of the present application (See, for example, FIGS. 14A-14B), the gate structure 38 of the transistor is located directly on the dielectric layer 12, and the backside wrap around contact structure 50 is located entirely beneath and spaced apart from the gate structure 38.

In some embodiments of the present application (See, for example, FIGS. 14A-14B), the device further includes backside ILD layer 52 embedding the backside wrap around contact structure 50 and directly contacting the dielectric layer 12.

Figure 15B:
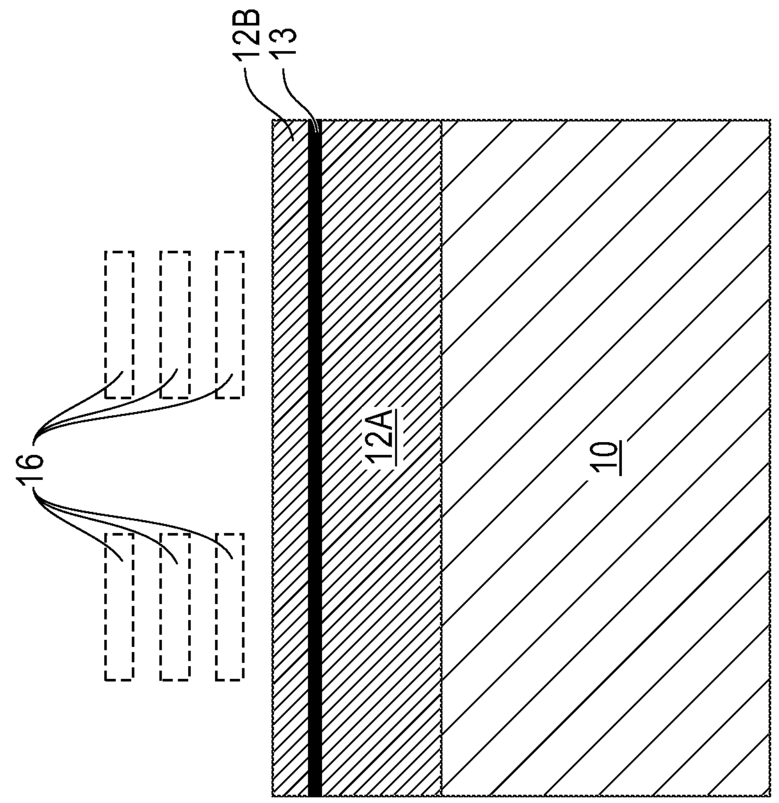
FIGS. 15A-15B are cross sectional views of an exemplary structure through cut A-A and cut B-B, respectively, of FIG. 1 that can be employed in accordance with another embodiment of the present application, the exemplary structure includes a substrate including a multilayered dielectric structure including an etch stop layer sandwiched between a first dielectric layer and a second dielectric layer, at least one nanosheet stack of alternating sacrificial semiconductor material nanosheets and semiconductor channel material nanosheets located on the multilayered dielectric structure, and a sacrificial gate structure located on the at least one nanosheet stack.
Figure 15A:
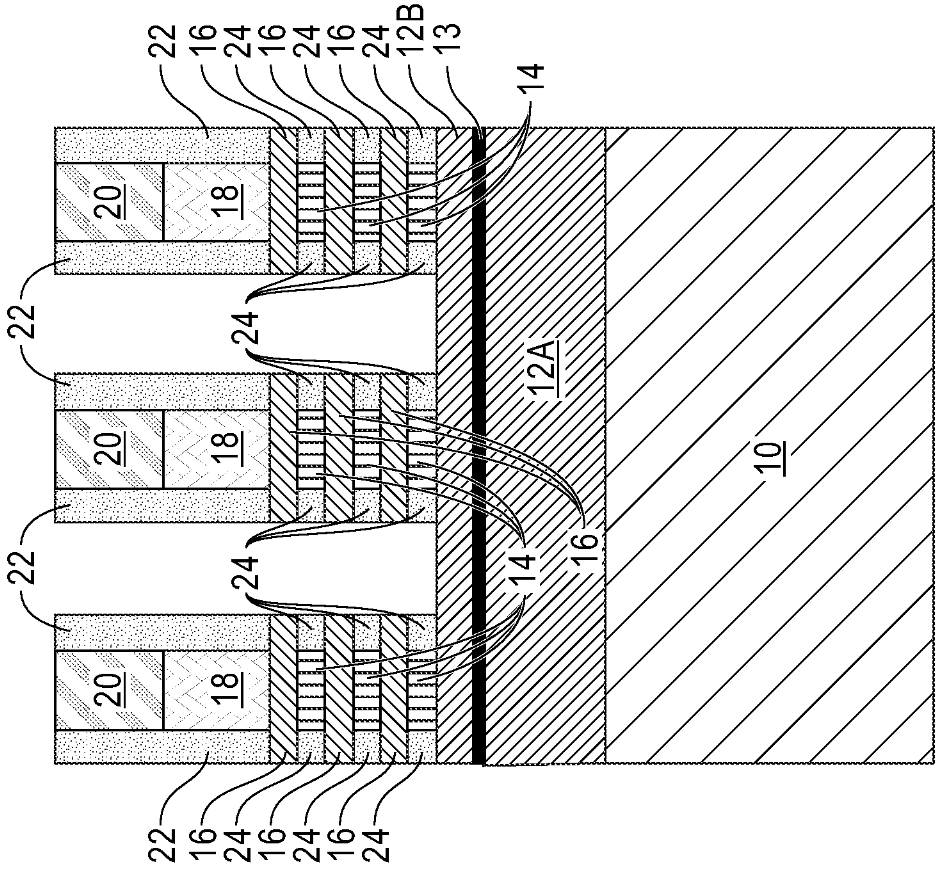

Referring now to FIGS. 15A-15B, there are illustrated an exemplary structure through cut A-A and cut B-B, respectively, of FIG. 1 that can be employed in accordance with another embodiment of the present application. The exemplary structure of this embodiment includes a substrate including a multilayered dielectric structure including an etch stop layer 13 sandwiched between a first dielectric layer 12A and a second dielectric layer 12B, at least one nanosheet stack of alternating sacrificial semiconductor material nanosheets 14 and semiconductor channel material nanosheets 16 located on the multilayered dielectric structure, and a sacrificial gate structure 18 located on the at least one nanosheet stack. The multilayered dielectric structure is located on semiconductor base layer 10. The exemplary structure can further include a hard mask cap 20, a gate spacer 22, and inner spacers 24, as shown in FIG. 15A. In some embodiments, the hard mask cap 20 can be omitted. When present, the hard mask cap 20 is located on a topmost surface of the sacrificial gate structure 18. The gate spacer 22 is located on a sidewall of the sacrificial gate structure and, if present, a sidewall of the hard mask cap 20. The inner spacers 24 are located at both ends of each of the sacrificial semiconductor material nanosheets 14 and beneath each of the semiconductor channel material nanosheets 16.

The semiconductor base layer 10, sacrificial semiconductor material nanosheets 14, semiconductor channel material nanosheets 16, sacrificial gate structure 18, hard mask cap 20, gate spacer 22, and inner spacers 24 that are employed in the exemplary structure illustrated in FIGS. 15A-15B are the same as those described above for the exemplary structure illustrated in FIGS. 2A-2B.

In this embodiment of the present application, the first dielectric layer 12A of the multilayered dielectric structure is composed of a first dielectric material such as, for example, silicon dioxide and/or boron nitride. The second dielectric layer 12B of the multilayered dielectric structure is composed of a second dielectric material such as, for example, silicon dioxide and/or boron nitride. The second dielectric material can be compositionally the same as, or compositionally different from, the first dielectric material. The etch stop layer 13 of the multilayered dielectric structure is composed of a third dielectric material that is compositionally different from both the first dielectric material and the second dielectric material. The third dielectric material that provides the etch stop layer 13 can include, but is not limited to, SiN, SiC, SiCO or AlN. The multilayered dielectric structure can be formed utilizing deposition processes such as, for example, CVD, PECVD, PVD or ALD. In the present application, the first dielectric layer 12A has a thickness that is greater than a thickness of both the etch stop layer 13 and the second dielectric layer 12B.

The exemplary structure illustrated in FIGS. 15A-15B can be formed utilizing any well-known nanosheet formation process including the one briefly described above with respect to forming the exemplary structure shown in FIGS. 2A-2B.

Figure 16B:
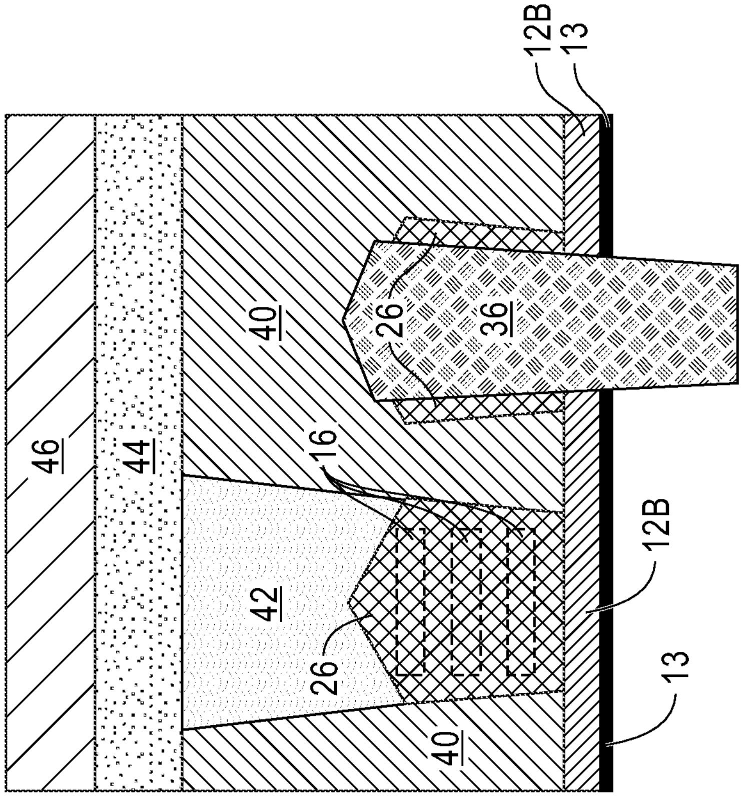
FIGS. 16A-16B are cross sectional views of the exemplary structure shown in FIGS. 15A-15B, respectively, after performing frontside processing as illustrated in FIGS. 3A-9B, flipping the structure and removing a semiconductor base layer of the substrate and the first dielectric layer of the multilayered dielectric structure to physically expose the etch stop layer and reveal a lower portion of the source/drain trench structure.
Figure 16A:
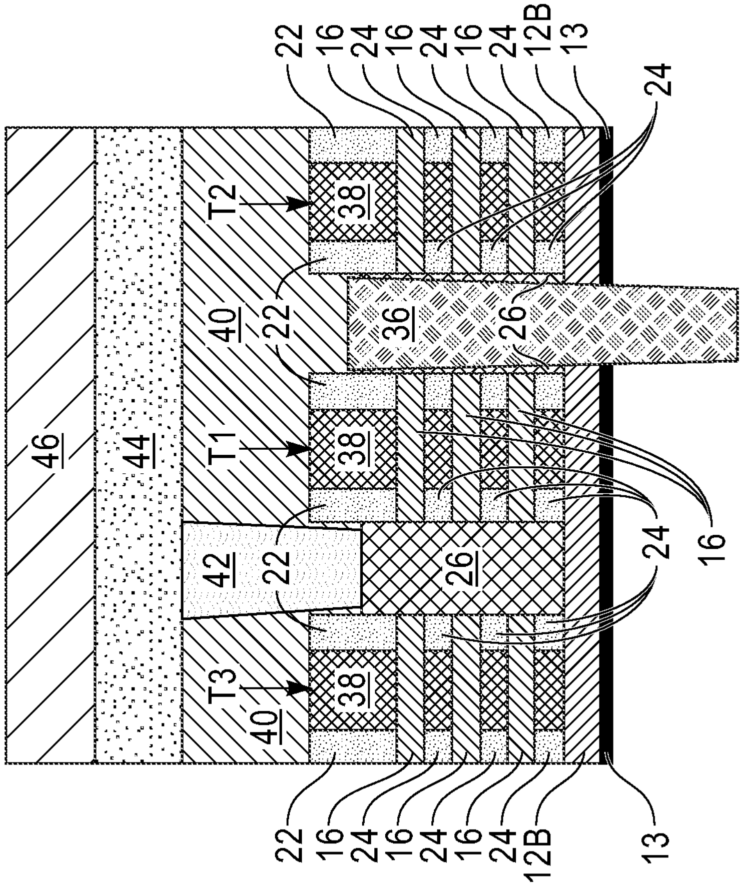

Referring now to FIGS. 16A-16B, there are illustrated the exemplary structure shown in FIGS. 15A-15B, respectively, after performing frontside processing as illustrated in FIGS. 3A-9B (thus all elements/components listed in FIGS. 16A-16B are the same as those described previously, and those elements/components listed in FIGS. 16A-16B include materials as also described previously herein), flipping the structure and removing semiconductor base layer 10 of the substrate and the first dielectric layer 12A of the multilayered dielectric structure to physically expose the etch stop layer 13 and reveal a lower portion of the source/drain trench structure 36. The flipping of the structure and the removal of the semiconductor base layer 10 are the same as described above. The removal of the semiconductor base layer 10 stops on the first dielectric layer 12A of the multilayered dielectric structure. The reveled first dielectric layer 12A of the multilayered dielectric structure is then removed utilizing a material removal process that is selective in removing the first dielectric material relative to the third dielectric material that provides the etch stop layer 13. In this embodiment, at least 10%, more typically 20%, and even more typically from 25% to 50% of the source/drain trench structure 36 is physically exposed.

Figure 17B:
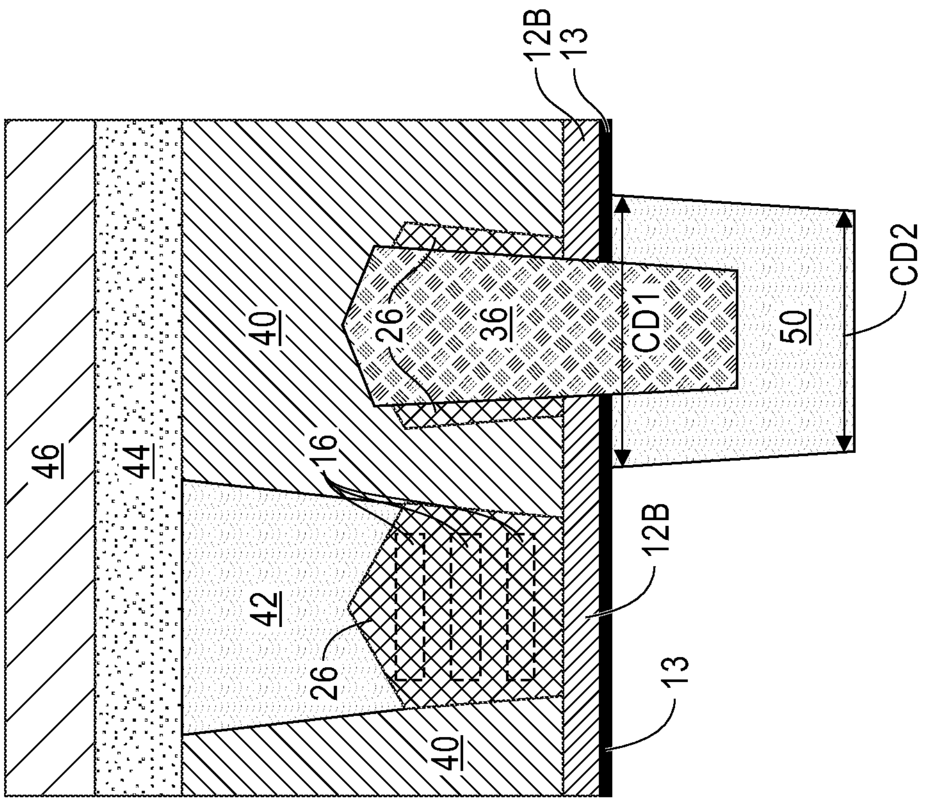
FIGS. 17A-17B are cross sectional views of the exemplary structure shown in FIGS. 16A-16B, respectively, after forming a backside wrap around contact structure contacting the revealed lower portion of the source/drain trench structure.
Figure 17A:
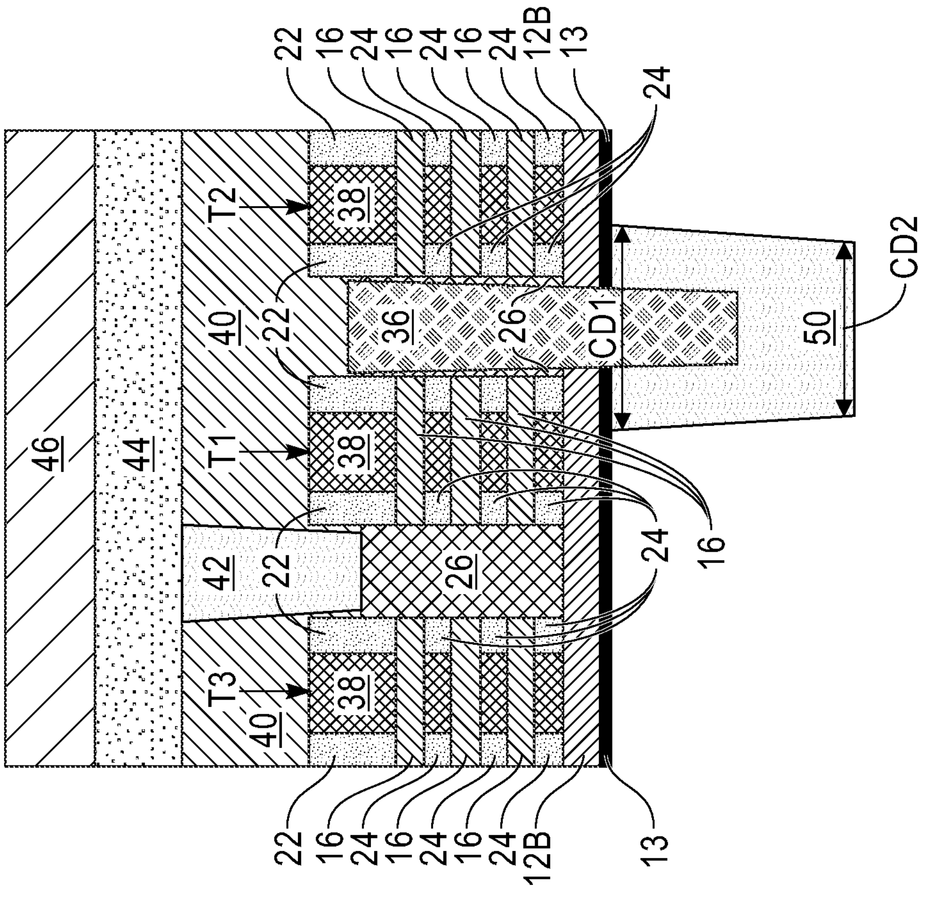

Referring now to FIGS. 17A-17B, there are illustrated the exemplary structure shown in FIGS. 16A-16B, respectively, after forming a backside wrap around contact structure 50 contacting the revealed lower portion of the source/drain trench structure 36. The various implantations and activation anneal mentioned above can be performed on the revealed lower portion of the source/drain trench structure 38 prior to forming the backside wrap around contact structure 50. The backside wrap around contact structure 50 includes a contact conductor material as defined above and it can be formed utilizing the technique illustrated in FIGS. 12A-13B of the present application. That is, the backside wrap around contact structure 50 can be formed by first forming contact metal-containing layer 50L, as defined above, and performing a substrative etch as defined above. In this embodiment, the backside wrap around contact structure 50 forms an interface with the etch stop layer 13, and an interface with the physically exposed lower portion of the source/drain trench structure 36. Notably, backside wrap around contact structure 50 forms an interface with each sidewall and bottommost surface of the physically exposed lower portion of the source/drain trench structure 36.

Figure 18B:
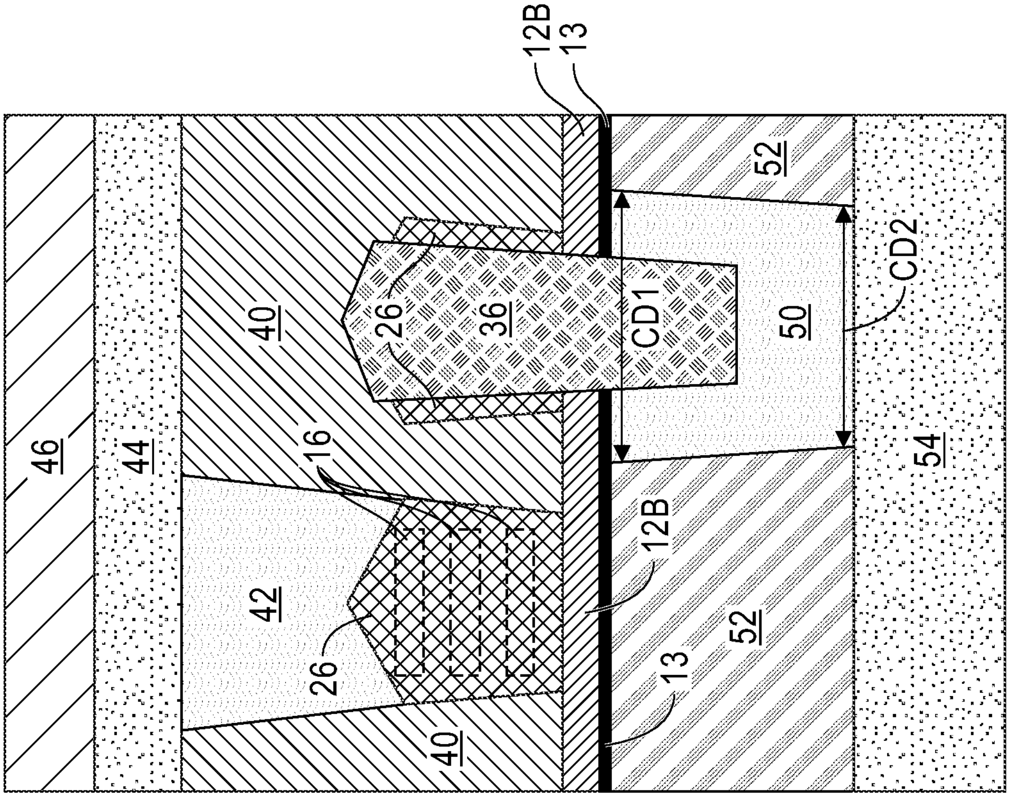
FIGS. 18A-18B are cross sectional views of the exemplary structure shown in FIGS. 17A-17B, respectively, after forming a backside ILD layer and a backside interconnect structure.
Figure 18A:
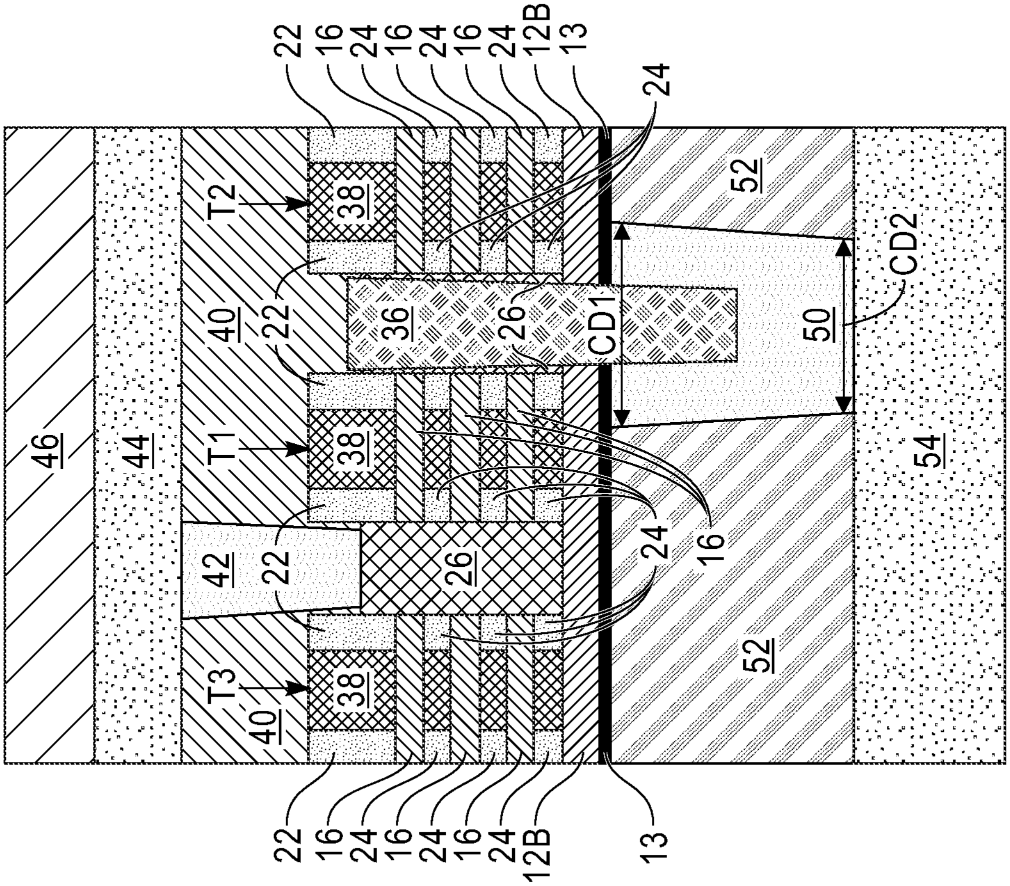

Referring now to FIGS. 18A-18B, there are illustrated the exemplary structure shown in FIGS. 17A-17B, respectively, after forming backside ILD layer 52 and backside interconnect structure 54. The backside ILD layer 52 and the backside interconnect structure 54 that are present in the exemplary structure shown in FIGS. 18A-18B are the same as shown and described with respect to FIGS. 14A-14B.

FIGS. 18A-18B illustrates a semiconductor device in accordance with the present application. The semiconductor device includes a transistor (e.g., T1) that is located on a frontside of a dielectric layer (i.e., the second dielectric layer 12B). The transistor (e.g., T1) includes source/drain region 26 located on a first side of gate structure 38 and source/drain trench structure 36 located on a second side of gate structure 38 that is opposite the first side. The source/drain trench structure 36 extends through the dielectric layer (i.e., second dielectric layer 12B) and etch stop layer 13 that is located on the backside of the dielectric layer, has an upper portion located on the frontside of the dielectric layer (e.g., the second dielectric layer 12B), and a lower portion located on the backside of the dielectric layer (e.g., the second dielectric layer 12B) and beneath the etch stop layer 13. The semiconductor device further includes backside wrap around contact structure 50 that physically contacts, and wraps around, the lower portion of the source/drain trench structure 36. In this embodiment, the backside wrap around contact structure 50 is spaced apart from the dielectric layer (e.g., second dielectric layer 12B) by etch stop layer 13. The backside wrap around contact structure 50 of this embodiment also has a topmost surface that is lower than a bottommost surface of the gate structure 38. The combination of the backside wrap around contact structure 50 and the source/drain trench structure 36 provides a semiconductor device that has an increased contact area, yet since the backside wrap around contact structure 50 is isolated from the gate structure 38 by both the dielectric layer (i.e., second dielectric layer 12B) and the etch stop layer 13, no significant increase in backside source/drain contact-to-gate capacitance is observed. The presence of the dielectric layer (i.e., second dielectric layer 12B) and the etch stop layer 13 not only provides isolation between the backside wrap around contact structure 50 and the gate structure 38, but they prevent any deleterious removal of the gate structure 38 during the formation of the backside wrap around contact structure 50. It is noted that the source/drain trench structure 36 of this embodiment can be substituted with a surface area enhanced source/drain trench structure 37 (described herein below) or an inner cavity-containing source/drain trench structure 36A (also described herein below).

In some embodiments (See, for example, the surface area enhanced source/drain trench structure 37 illustrated in FIGS. 20A-20B), the lower portion of the source/drain trench structure is diamond-shaped. The diamond-shaped modification to the source/drain trench structure increases the overall contact area of the source/drain trench structure, which in turn further reduces the contact resistance.

In some embodiments (See, for example, the inner cavity-containing source/drain trench structure 36A illustrated in FIGS. 24A-24B), the lower portion of the source/drain trench structure has an inner cavity with angled surfaces S1, and the backside wrap around contact structure 50 is in direct contact with the angled surfaces S1 of the inner cavity. The inclusion of an inner cavity to the source/drain trench structure increases the overall contact area of the source/drain trench structure, which in turn further reduces the contact resistance.

In some embodiments of the present application, the upper portion of the source/drain trench structure 36 is in direct physical contact with a semiconductor channel region (i.e., the semiconductor channel material nanosheets 16) of the transistor.

In some embodiments of the present application (See, for example, FIG. 18A), the upper portion of the source/drain trench structure 36 is in contact with a semiconductor channel region (i.e., the semiconductor channel material nanosheets 16) of the transistor via a portion of a source/drain region 26 that is present on the second side of the gate structure 38. This ensures that the backside wrap around contact structure 50 has no horizontal overlap with the gate structure 38.

In some embodiments of the present application (See, for example, FIGS. 18A-18B), the device further includes frontside BEOL interconnect structure 44 located above the transistor. In such an embodiment, the source/drain region 26 on the first side of the gate structure 38 is in electrical contact with the frontside BEOL interconnect structure 44 by frontside source/drain contact structure 42.

In some embodiments of the present application (See, for example, FIGS. 18A-18B), backside interconnect structure 54 contacts the backside wrap around contact structure 50.

In some embodiments of the present application (See, for example, FIGS. 18A-18B), the backside wrap around contact structure 50 has an upper portion having a first critical dimension CD1 and a lower portion having a second critical dimension CD2 in which CD2 is larger than CD1.

In some embodiments of the present application (See, for example, FIGS. 18A-18B), the gate structure 38 of the transistor is located directly on the dielectric layer 12, and the backside wrap around contact structure 50 is located entirely beneath and spaced apart from the gate structure 38.

Figure 19B:
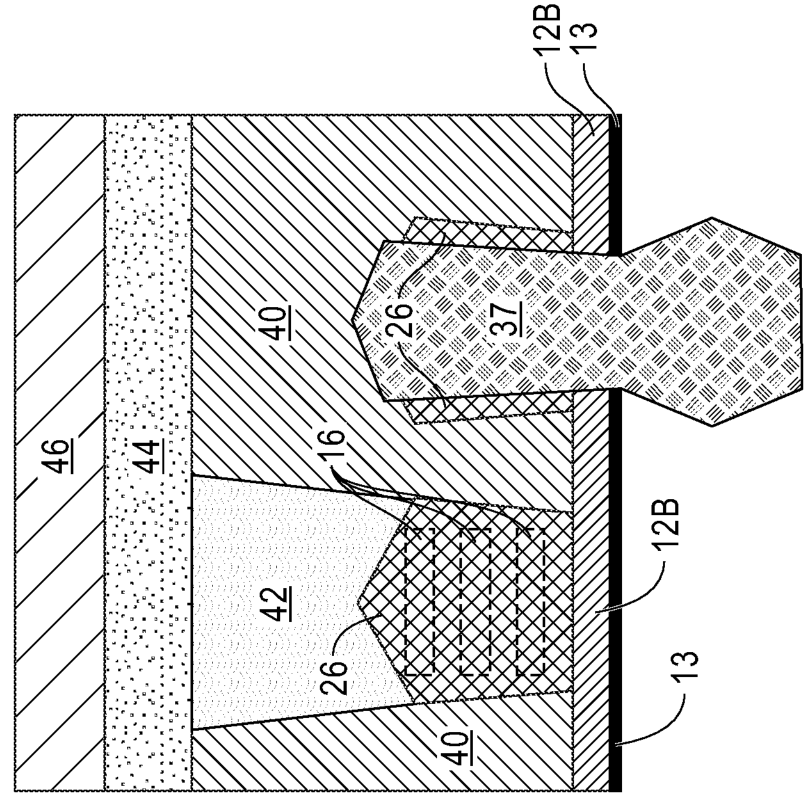
FIGS. 19A-19B are cross sectional views of the exemplary structure shown in FIGS. 16A-16B, respectively, after enlarging the surface area of the revealed lower portion of the source/drain trench structure.
Figure 19A:
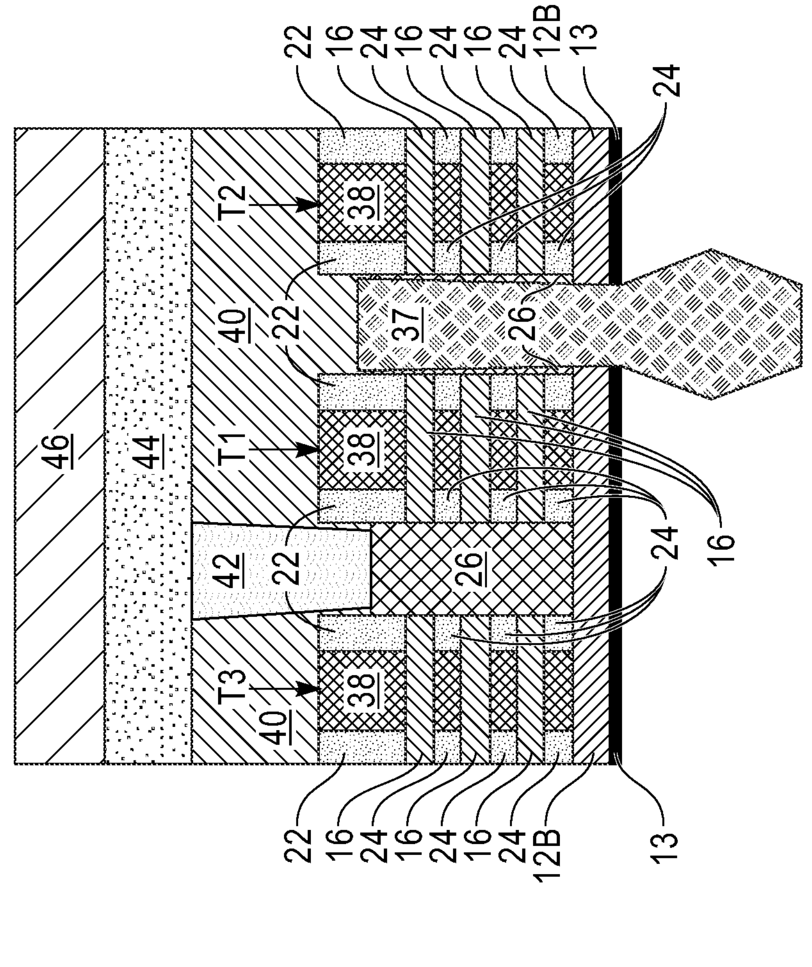

Referring now to FIGS. 19A-19B, there are illustrated the exemplary structure shown in FIGS. 16A-16B, respectively, after enlarging the surface area of the revealed lower portion of the source/drain trench structure 36 to provide a surface area enhanced source/drain trench structure 37 having a physically exposed lower portion that has a greater surface area than the original physically exposed lower portion of the source/drain trench structure 36. In embodiments, the physically exposed lower portion of the surface area enhanced source/drain trench structure 37 is diamond-shaped. The enlarging of the surface area includes epitaxial growing additional fifth semiconductor material (doped with a same conductivity type dopant used in initially forming the source/drain trench structure 36). The enlarged surface area provides for a greater contact area for the backside wrap around contact structure 50. Although not illustrated in the present application, the source/drain trench structure 36 illustrated in FIGS. 14A-14B can be replaced with the surface area enhanced source/drain trench structure 37.

Referring now to FIGS. 20A-20B, there are illustrated the exemplary structure shown in FIGS. 19A-19B, respectively, after forming backside wrap around contact structure 50 contacting the enlarged surface area of the lower portion of the source/drain trench structure 37, forming backside ILD layer 52, and forming backside interconnect structure 54. The various implantations and activation anneal mentioned above can be performed on the surface area enhanced source/drain trench structure 37 prior to forming the backside wrap around contact structure 50. Each of the backside wrap around contact structure 50, the backside ILD layer 52, the backside interconnect structure 54 includes materials as previously described above, and each of the of the backside wrap around contact structure 50, the backside ILD layer 52, the backside interconnect structure 54 can be formed utilizing techniques as mentioned above.

FIGS. 20A-20B illustrates a semiconductor device in accordance with the present application. The semiconductor device includes a transistor (e.g., T1) that is located on a frontside of a dielectric layer (i.e., the second dielectric layer 12B). The transistor includes source/drain region 26 located on a first side of gate structure 38 and surface area enhanced source/drain trench structure 37 located on a second side of gate structure 38 that is opposite the first side. The surface area enhanced source/drain trench structure 37 extends through the dielectric layer (i.e., second dielectric layer 12B) and etch stop layer 13 that is located on the backside of the dielectric layer and has an upper portion located on the frontside of the dielectric layer, and a lower portion located on the backside of the dielectric layer and beneath the etch stop layer 13. The semiconductor device further includes backside wrap around contact structure 50 that physically contacts, and wraps around, the lower portion of the surface area enhanced source/drain trench structure 37. In this embodiment, the backside wrap around contact structure 50 is spaced apart from gate structure 38 by both the dielectric layer (e.g., second dielectric layer 12B) and the etch stop layer 13.

Figure 21A:
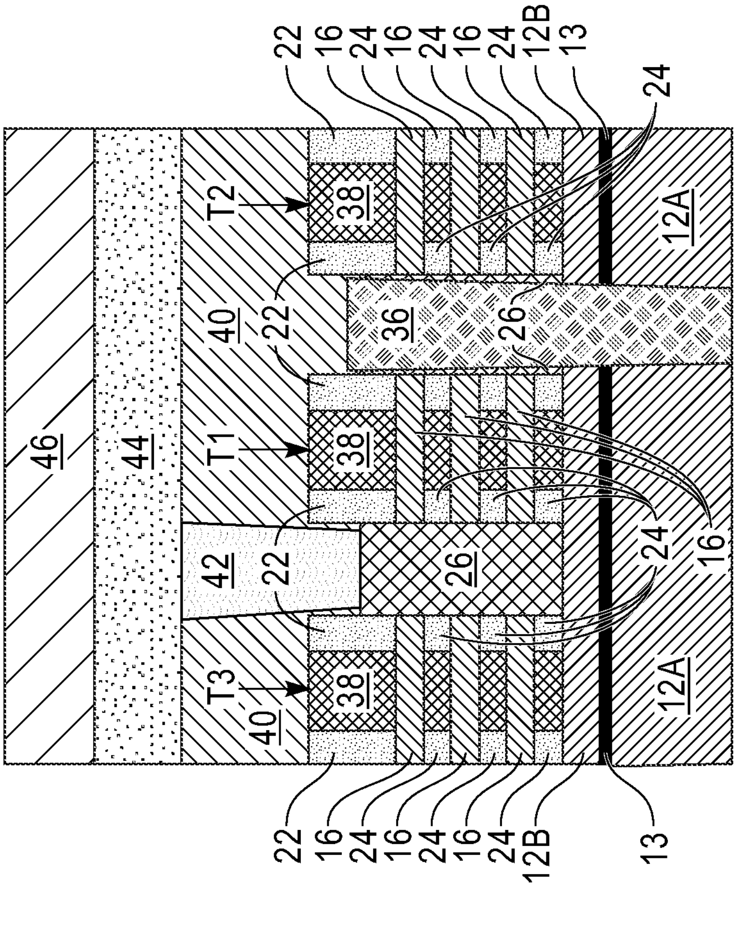
FIGS. 21A-21B are cross sectional views of the exemplary structure shown in FIGS. 15A-15B, respectively, after performing frontside processing as illustrated in FIGS. 3A-9B, flipping the structure and removing a semiconductor base layer of the substrate to physically expose the first dielectric layer of the multilayered dielectric structure.
Figure 21B:
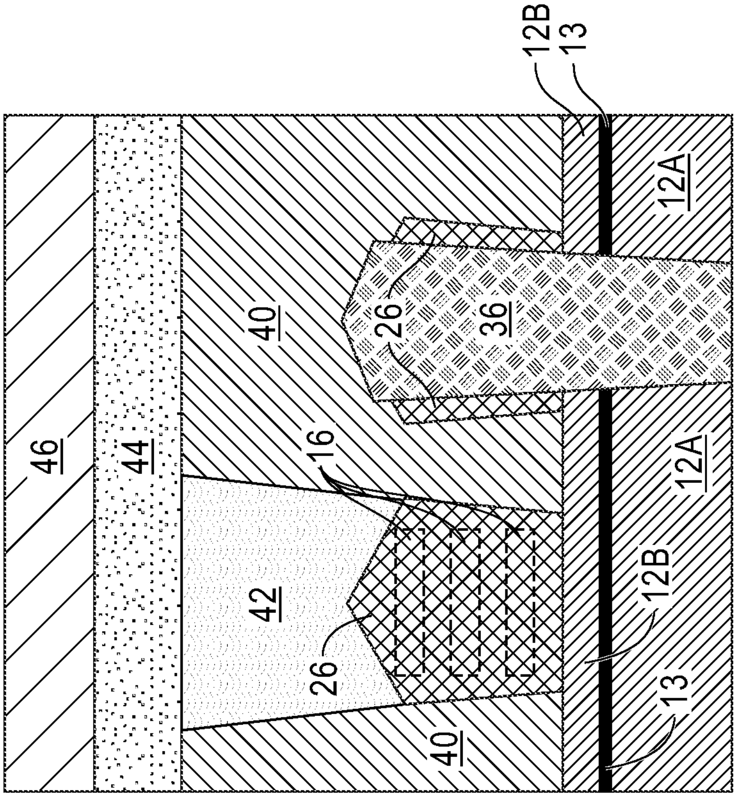

Referring now to FIGS. 21A-21B, there are illustrated the exemplary structure shown in FIGS. 15A-15B, respectively, after performing frontside processing as illustrated in FIGS. 3A-9B, flipping the structure and removing semiconductor base layer 10 of the substrate to physically expose the first dielectric layer 12A of the multilayered dielectric structure.

The semiconductor base layer 10, the first dielectric layer 12A, the etch stop layer 13, second dielectric layer 12B sacrificial semiconductor material nanosheets 14, semiconductor channel material nanosheets 16, sacrificial gate structure 18, hard mask cap 20, gate spacer 22, and inner spacers 24 that are employed in the exemplary structure illustrated in FIGS. 21A-21B are the same as those described above for the exemplary structure illustrated in FIGS. 2A-2B and 15A-15B. The exemplary structure illustrated in FIGS. 21A-22B can be formed utilizing any well-known nanosheet formation process including the one briefly described above with respect to forming the exemplary structure shown in FIGS. 2A-2B.

Figure 22B:
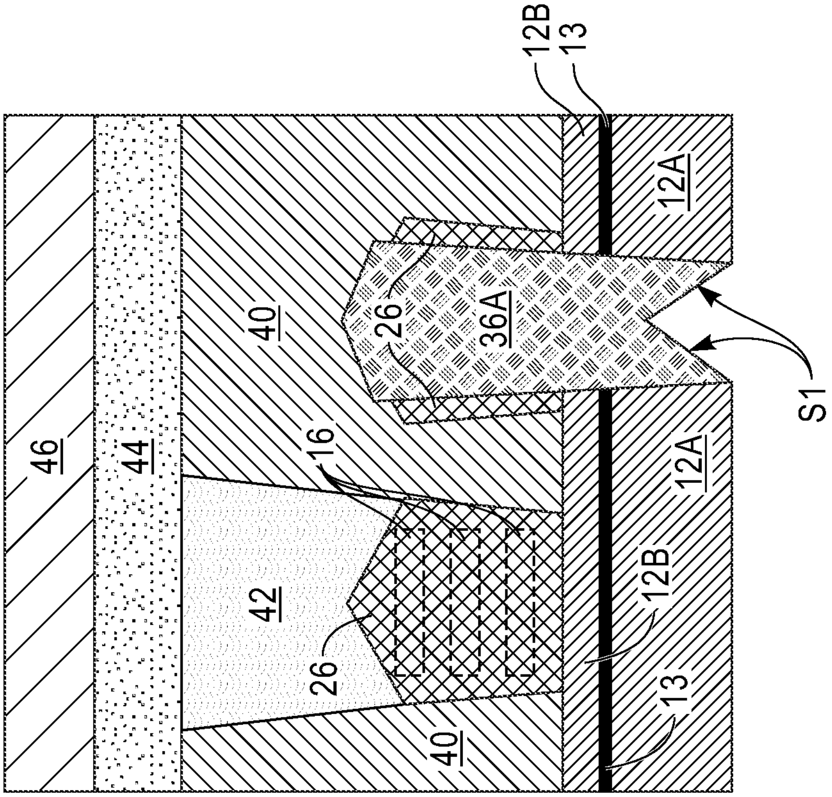
FIGS. 22A-22B are cross sectional views of the exemplary structure shown in FIGS. 21A-21B, respectively, after etching a physically exposed surface of the source/drain trench structure to create inner cavity-containing source/drain trench structure.
Figure 22A:
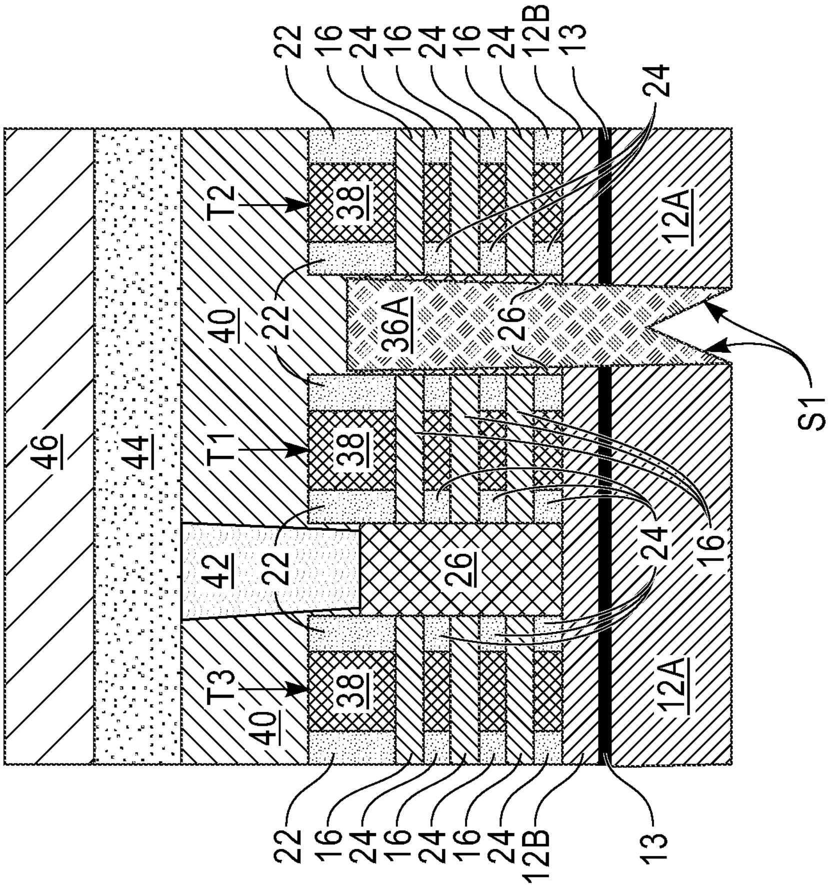

Referring now to FIGS. 22A-22B, there are illustrated the exemplary structure shown in FIGS. 21A-21B, respectively, after etching a physically exposed surface of the source/drain trench structure 36 to create inner cavity-containing source/drain trench structure 36A. The inner cavity-containing source/drain trench structure 36A has angled surfaces S1 that extend inward and meet at point as shown in FIGS. 22A-22B. Notably, inner cavity-containing source/drain trench structure 36A has an inner cavity that is defined by the angled surfaces S1. The etching of the physically exposed surface of the source/drain trench structure 36 includes a semiconductor etch such as, for example, a crystallographic wet etch. Although not illustrated in the present application, the source/drain trench structure 36 illustrated in FIGS. 14A-14B can be replaced with the inner cavity-containing source/drain trench structure 36A.

Figure 23B:
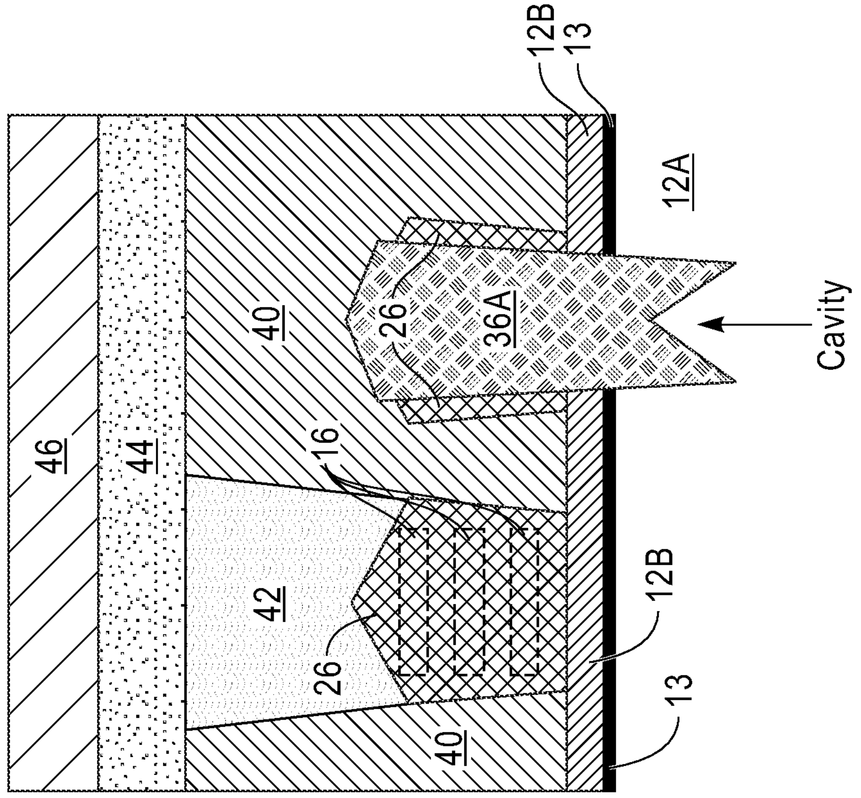
FIGS. 23A-23B are cross sectional views of the exemplary structure shown in FIGS. 22A-22B, respectively, after removing the physically exposed first dielectric layer to physically expose the etch stop layer of the multilayered dielectric structure and to reveal a lower portion of the inner cavity-containing source/drain trench structure.
Figure 23A:
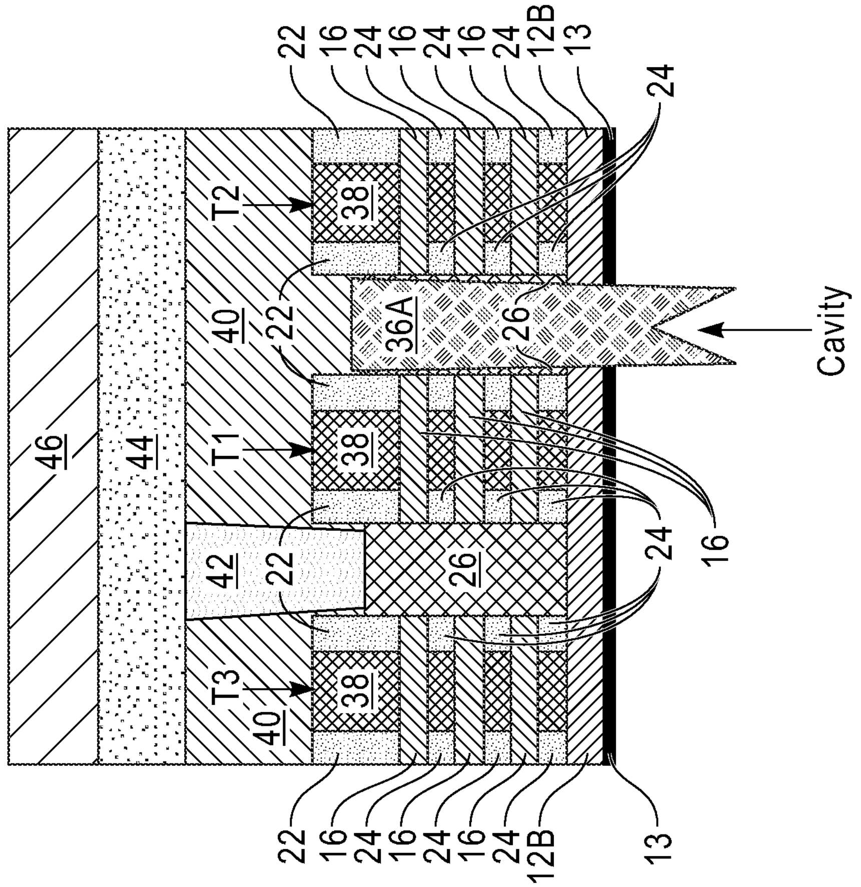

Referring now to FIGS. 23A-23B, there are illustrated the exemplary structure shown in FIGS. 22A-22B, respectively, after removing the physically exposed first dielectric layer 12A to physically expose the etch stop layer 13 of the multilayered dielectric structure and to reveal a lower portion of the inner cavity-containing source/drain trench structure 36A. The removal of the first dielectric layer 12A includes an etch as described above for removing the same layer from the exemplary structure shown in FIGS. 16A-16B.

Referring now to FIGS. 24A-24B, there are illustrated the exemplary structure shown in FIGS. 23A-23B, respectively, after forming backside wrap around contact structure 50 contacting the lower portion of the inner cavity-containing source/drain trench structure 36A, forming backside ILD layer 52, and forming backside interconnect structure 54. The various implantations and activation anneal mentioned above can be performed on inner cavity-containing source/drain trench structure 36A prior to forming the backside wrap around contact structure 50. Each of the backside wrap around contact structure 50, the backside ILD layer 52, the backside interconnect structure 54 includes materials as previously described above, and each of the of the backside wrap around contact structure 50, the backside ILD layer 52, the backside interconnect structure 54 can be formed utilizing techniques as mentioned above. In this embodiment, the backside wrap around contact structure 50, is contained in the inner cavity of the inner cavity-containing source/drain trench structure 36A and it directly contacts angled surfaces S1. The backside wrap around contact structure 50 also directly contacts, and thus forms an interface, with the sidewalls of the inner cavity-containing source/drain trench structure 36A as well as the etch stop layer 13.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device comprising:

a transistor located on a frontside of a dielectric layer, the transistor comprising a source/drain region located on a first side of a gate structure and a source/drain trench structure located on a second side of the gate structure, wherein the source/drain trench structure extends through the dielectric layer, has an upper portion located on the frontside of the dielectric layer and a lower portion located on the backside of the dielectric layer; and a backside wrap around contact structure that physically contacts, and wraps around, the lower portion of the source/drain trench structure, wherein the backside wrap around contact structure is in direct contact with the dielectric layer and has a topmost surface that is lower than a bottommost surface of the gate structure.

2. The semiconductor device of claim 1, wherein the lower portion of the source/drain trench structure is diamond-shaped.

3. The semiconductor device of claim 1, wherein the lower portion of the source/drain trench structure has an inner cavity with angled surfaces, and the backside wrap around contact structure is in direct contact with the angled surfaces of the inner cavity.

4. The semiconductor device of claim 1, wherein the upper portion of the source/drain trench structure is in direct physical contact with a semiconductor channel region of the transistor.

5. The semiconductor device of claim 1, wherein the upper portion of the source/drain trench structure is in contact with a semiconductor channel region of the transistor via a portion of a source/drain region that is present on the second side of the gate structure.

6. The semiconductor device of claim 1, further comprising a frontside back-end-of-the-line (BEOL) interconnect structure located above the transistor, wherein the source/drain region on the first side of the gate structure is in electrical contact with the frontside BEOL interconnect structure by a frontside source/drain contact structure.

7. The semiconductor device of claim 1, further comprising a backside interconnect structure contacting the backside wrap around contact structure.

8. The semiconductor device of claim 1, wherein the backside wrap around contact structure has an upper portion having a first critical dimension and a lower portion having a second critical dimension, wherein the second critical dimension is larger than the first critical dimension.

9. The semiconductor device of claim 1, wherein the gate structure of the transistor is located directly on the dielectric layer, and the backside wrap around contact structure is located entirely beneath and spaced apart from the gate structure.

10. The semiconductor device of claim 1, further comprising a backside interlayer dielectric layer embedding the backside wrap around contact structure and directly contacting the dielectric layer.

11. A semiconductor device comprising a transistor located on a frontside of a dielectric layer, the transistor comprising a source/drain region located on a first side of a gate structure and a source/drain trench structure located on a second side of the gate structure, wherein the source/drain trench structure extends through the dielectric layer and an etch stop layer that is located beneath the dielectric layer, has an upper portion located on the frontside of the dielectric layer and a lower portion located on the backside of the dielectric layer; and a backside wrap around contact structure that physically contacts, and wraps around, the lower portion of the source/drain trench structure, wherein the backside wrap around contact structure is spaced apart from the dielectric layer by the etch stop layer the backside wrap around contact structure is in direct contact with the dielectric layer and has a topmost surface that is lower than a bottommost surface of the gate structure.

12. The semiconductor device of claim 11, wherein the lower portion of the source/drain trench structure is diamond-shaped.

13. The semiconductor device of claim 11, wherein the lower portion of the source/drain trench structure has an inner cavity with angled surfaces, and the backside wrap around contact structure is in direct contact with the angled surfaces of the inner cavity.

14. The semiconductor device of claim 11, wherein the upper portion of the source/drain trench structure is in direct physical contact with a semiconductor channel region of the transistor.

15. The semiconductor device of claim 11, wherein the upper portion of the source/drain trench structure is in contact with a semiconductor channel region of the transistor via a portion of a source/drain region that is present on the second side of the gate structure.

16. The semiconductor device of claim 11, further comprising a frontside back-end-of-the-line (BEOL) interconnect structure located above the transistor, wherein the source/drain region on the first side of the gate structure is in electrical contact with the frontside BEOL interconnect structure by a frontside source/drain contact structure.

17. The semiconductor device of claim 11, further comprising a backside interconnect structure contacting the backside wrap around contact structure.

18. The semiconductor device of claim 11, wherein the backside wrap around contact structure has an upper portion having a first critical dimension and a lower portion having a second critical dimension, wherein the second critical dimension is larger than the first critical dimension.

19. The semiconductor device of claim 11, wherein the backside wrap around contact structure has an upper portion having a first critical dimension and a lower portion having a second critical dimension, wherein the second critical dimension is larger than the first critical dimension.

20. The semiconductor device of claim 11, wherein the gate structure of the transistor is located directly on the dielectric layer, and the backside wrap around contact structure is located entirely beneath and spaced apart from the gate structure.

* * * * *